United States Patent
Chung et al.

(10) Patent No.: US 11,424,757 B2
(45) Date of Patent: Aug. 23, 2022

(54) SUCCESSIVE APPROXIMATION REGISTER ANALOG-TO-DIGITAL CONVERTER WITH CALIBRATION FUNCTION AND CALIBRATION METHOD THEREOF

(71) Applicant: Industrial Technology Research Institute, Hsinchu (TW)

(72) Inventors: Yung-Hui Chung, Hsinchu (TW); Qi-Feng Zeng, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 17/134,150

(22) Filed: Dec. 24, 2020

(65) Prior Publication Data

US 2021/0203349 A1    Jul. 1, 2021

(30) Foreign Application Priority Data

Dec. 31, 2019    (TW) .................................. 108148524

(51) Int. Cl.
*H03M 1/10*    (2006.01)
*H03M 1/46*    (2006.01)
*H03M 1/08*    (2006.01)

(52) U.S. Cl.
CPC ............. *H03M 1/468* (2013.01); *H03M 1/08* (2013.01); *H03M 1/1009* (2013.01); *H03M 1/462* (2013.01)

(58) Field of Classification Search
CPC ........ H03M 1/468; H03M 1/804; H03M 1/38; H03M 1/1004; H03M 1/765;
(Continued)

(56) References Cited

U.S. PATENT DOCUMENTS 9,154,152 B1    10/2015    Chiu et al.
9,553,599 B1 *   1/2017    Chen .................. H03M 1/1033
(Continued)

FOREIGN PATENT DOCUMENTS

CN    106953638    7/2017
TW    201310918    3/2013
(Continued)

OTHER PUBLICATIONS

Chun C. Lee et al., "A 12b 70MS/s SAR ADC with digital startup calibration in 14nm CMOS," 2015 Symposium on VLSI Circuits (VLSI Circuits), Kyoto, Jun. 17-19, 2015, pp. C62-C63.
(Continued)

*Primary Examiner* — Linh V Nguyen
(74) *Attorney, Agent, or Firm* — JCIPRNET

(57) ABSTRACT

A successive approximation register analog-to-digital converter (SAR ADC) with calibration function and a calibration method thereof are provided. The SAR ADC has at least one capacitor digital-to-analog converter (CDAC), having Nd capacitors corresponding to Nd bits; and a controller. The calibration method includes: coupling the capacitors of an i-th to an (Nd−1)-th bit to a first reference voltage, and generating a first digital code based an operation of the capacitors of an (i−1)-th bit to a 0-th bit; coupling the capacitors of an (i+1)-th bit to the (Nd−1)-th bit to the first reference voltage, coupling the capacitor of the i-th bit to a second reference voltage, and generating a second digital code based on the operation of the capacitors of the (i−1)-th bit to the 0-th bit; generating a capacitor weight of the capacitor of the i-th bit; and calibrating the SAR ADC based on the capacitor weight.

31 Claims, 14 Drawing Sheets

(58) Field of Classification Search
CPC .. H03M 1/1009; H03M 1/1019; H03M 1/462;
H03M 1/1047; H03M 1/1245; H03M
1/466; H03M 1/68; H03M 1/1038; H03M
1/1042; H03M 1/1052; H03M 1/144;
H03M 1/0697; H03M 1/0881; H03M
1/1028; H03M 1/1061; H03M 1/181;
H03M 1/187; H03M 1/687; H03M
1/0602; H03M 1/1071; H03M 1/403;
H03M 1/442; H03M 1/14
USPC .......................... 341/118–121, 150, 155, 172
See application file for complete search history.

(56) References Cited

U.S. PATENT DOCUMENTS

| | | | |
|---|---|---|---|
| 9,559,716 | B1 | 1/2017 | Matsui et al. |
| 9,893,739 | B2 | 2/2018 | Bode |
| 10,243,577 | B1* | 3/2019 | Berens ................ H03M 1/1042 |
| 10,447,289 | B1 | 10/2019 | Shikata et al. |
| 10,523,228 | B1* | 12/2019 | Chao ................... H03M 1/1033 |
| 10,637,493 | B1* | 4/2020 | Geddada ............... H03M 1/468 |
| 2007/0075884 | A1 | 4/2007 | Melanson et al. |
| 2009/0121907 | A1* | 5/2009 | Kuramochi ......... H03M 1/1047 341/120 |
| 2011/0122006 | A1* | 5/2011 | Liao .................... H03M 1/1047 341/120 |
| 2012/0075128 | A1* | 3/2012 | Aruga ................. H03M 1/1019 341/110 |
| 2013/0162454 | A1* | 6/2013 | Lin ....................... H03M 1/125 341/161 |
| 2015/0263756 | A1* | 9/2015 | Chiu ....................... H03M 1/08 341/172 |
| 2016/0079995 | A1* | 3/2016 | Zare-Hoseini ........ H03M 1/403 341/120 |

FOREIGN PATENT DOCUMENTS

| | | |
|---|---|---|
| TW | 201322641 | 6/2013 |
| TW | 201328197 | 7/2013 |
| TW | I501562 | 9/2015 |
| TW | I568192 | 1/2017 |
| TW | 201918034 | 5/2019 |

OTHER PUBLICATIONS

Yan Zhu et al., "A 10.4-ENOB 120MS/s SAR ADC with DAC linearity calibration in 90nm CMOS," 2013 IEEE Asian Solid-State Circuits Conference (A-SSCC), Singapore, Nov. 11-13, 2013, pp. 69-72.

Yuan Zhou et al., "A 12 bit 160 MS/s Two-Step SAR ADC With Background Bit-Weight Calibration Using a Time-Domain Proximity Detector," IEEE Journal of Solid-State Circuits, vol. 50, Issue 4, Apr. 2015, pp. 920-931.

Wei-Hsin Tseng et al., "A 12-bit 104 MS/s SAR ADC in 28 nm CMOS for Digitally-Assisted Wireless Transmitters," IEEE Journal of Solid-State Circuits, vol. 51, Issue 10, Oct. 2016, pp. 2222-2231.

Wenbo Liu et al., "A 12-bit, 45-MS/s, 3-mW Redundant Successive-Approximation-Register Analog-to-Digital Converter With Digital Calibration," IEEE Journal of Solid-State Circuits, vol. 46, Issue 11, Nov. 2011, pp. 2661-2672.

Ruoyu Xu et al., "Digitally Calibrated 768-kS/s 10-b Minimum-Size SAR ADC Array With Dithering," IEEE Journal of Solid-State Circuits, vol. 47, Issue 9, Sep. 2012, pp. 2129-2140.

"Office Action of Taiwan Counterpart Application", dated Jun. 18, 2020, p. 1-p. 5.

* cited by examiner

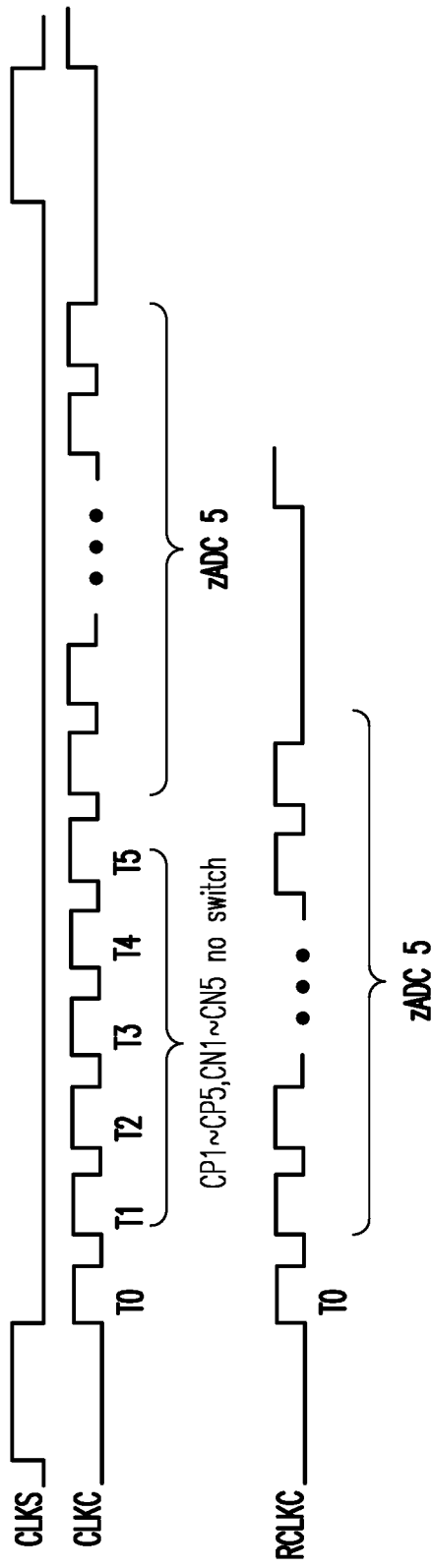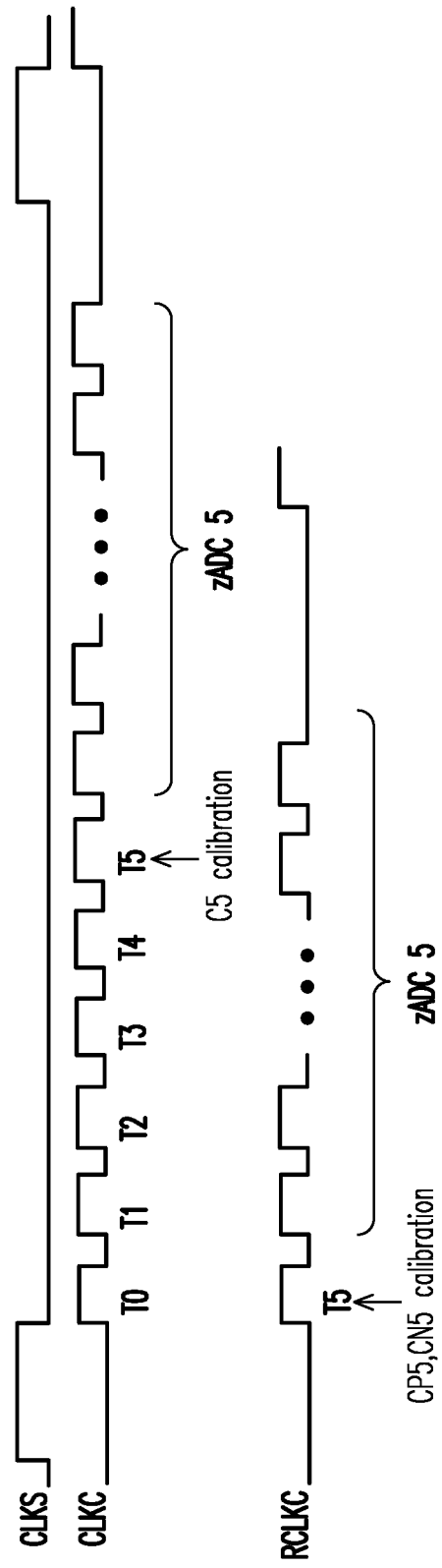

SUCCESSIVE APPROXIMATION REGISTER ANALOG-TO-DIGITAL CONVERTER WITH CALIBRATION FUNCTION AND CALIBRATION METHOD THEREOF

CROSS-REFERENCE TO RELATED APPLICATION

This application claims the priority benefit of Taiwan application serial no. 108148524, filed on Dec. 31, 2019. The entirety of the above-mentioned patent application is hereby incorporated by reference herein and made a part of this specification.

BACKGROUND

Technical Field

The disclosure relates to a calibration method of an analog-to-digital converter, and particularly relates to a calibration method and a circuit of a successive approximation register analog-to-digital converter.

Description of Related Art

The performance of the analog-to-digital converter may affect the accuracy of the instrument measurement, so the linearity of the analog-to-digital converter may be designed to meet some specifications. The manufacturer of wafers provides mismatched parameters of all elements under each process. In the successive approximation register analog-to-digital converter (SAR ADC), the capacitor digital-to-analog converter (CDAC) affects the overall linearity. How to achieve a certain degree of linearity without overly magnifying the unit capacitance of the CDAC is one of the topics to be researched.

SUMMARY

According to an embodiment of the disclosure, a calibration method of a successive approximation register analog-to-digital converter (SAR ADC) is provided. The SAR ADC includes at least one capacitor digital-to-analog converter (CDAC) and a controller. The at least one CDAC includes Nd capacitors corresponding to Nd bits, where Nd is a positive integer. The capacitor calibration method of the SAR ADC includes the following steps. The capacitors of the z-th bit to the (Nd−1)-th bit are coupled to a first reference voltage, and a first digital code is generated based on an operation of the capacitors of the (z−1)-th bit to the 0-th bit, where z is an integer less than Nd. The capacitors of the (i+1)-th bit to the (Nd−1)-th bit are coupled to the first reference voltage, the capacitor of the i-th bit is coupled to a second reference voltage, and a second digital code is generated based on an operation of the capacitors of the (i−1)-th bit to the 0-th bit, where i is an integer less than Nd, and z is less than i. A capacitor weight of the capacitor of the i-th bit is generated based on the first digital code and the second digital code. The SAR ADC is calibrated based on the capacitor weight of the capacitor of the i-th bit.

According to an embodiment, the disclosure provides a calibration method of an SAR ADC. The SAR ADC includes at least one CDAC and a controller. The at least one CDAC includes Nd capacitors corresponding to Nd bits, where Nd is a positive integer. The capacitor calibration method of the SAR ADC includes the following steps. The capacitors of the i-th bit to the (Nd−1)-th bit are coupled to a first reference voltage, and a first digital code is generated based on an operation of the capacitors of the (i−1)-th bit to the 0-th bit, where i is an integer less than Nd. The capacitors of the (i+1)-th bit to the (Nd−1)-th bit are coupled to the first reference voltage, the capacitor of the i-th bit is coupled to a second reference voltage, and a second digital code is generated based on an operation of the capacitors of the (i−1)-th bit to the 0-th bit. A capacitor weight of the capacitor of the i-th bit is generated based on the first digital code and the second digital code. The SAR ADC is calibrated based on the capacitor weight of the capacitor of the i-th bit.

According to another embodiment, the disclosure provides an SAR ADC with calibration function, which includes at least one CDAC, controlled by multiple control signals to respectively control a switching operation of Nd switching capacitors of the at least one CDAC, where Nd is a positive integer; a comparator, coupled to the at least one CDAC and configured to compare an output of the at least one CDAC with a comparison voltage; and a controller, coupled to the comparator and the at least one CDAC, and configured to generate a control signal and a digital output signal based on an output of the comparator. In a calibration mode, the controller obtains a capacitor weight of the i-th bit of the at least one CDAC by a result of (Nd+1) operations of the comparator, where i is an integer less than Nd.

According to another embodiment of the disclosure, an SAR ADC with calibration function is provided, which includes at least one Nd-bit CDAC, having Nd capacitors, where Nd is a positive integer; and a controller, coupled to the at least one CDAC. The controller is configured to perform the following capacitor calibration procedure. The capacitors of the z-th bit to the (Nd−1)-th bit are coupled to a first reference voltage, and a first digital code is generated based on an operation of the capacitors of the (z−1)-th bit to the 0-th bit, where z is an integer less than Nd. The capacitors of the (i+1)-th bit to the (Nd−1)-th bit are coupled to the first reference voltage, the capacitor of the i-th bit is coupled to a second reference voltage, and a second digital code is generated based on an operation of the capacitors of the (i−1)-th bit to the 0-th bit, where i is an integer less than Nd, and z is less than i. A capacitor weight of the capacitor of the i-th bit is generated based on the first digital code and the second digital code. The SAR ADC is calibrated based on the capacitor weight of the capacitor of the i-th bit.

According to another embodiment, the disclosure discloses an SAR ADC with calibration function, which includes at least one Nd-bit CDAC, having Nd capacitors; and a controller, coupled to an output of a comparator and the at least one CDAC. The controller performs the following capacitor calibration procedure. The capacitors of the i-th bit to the (Nd−1)-th bit are coupled to a first reference voltage, and a first digital code is generated based on an operation of the capacitors of the (i−1)-th bit to the 0-th bit, where i is an integer less than Nd. The capacitors of the (i+1)-th bit to the (Nd−1)-th bit are coupled to the first reference voltage, the capacitor of the i-th bit is coupled to a second reference voltage, and a second digital code is generated based on an operation of the capacitors of the (i−1)-th bit to the 0-th bit. A capacitor weight of the capacitor of the i-th bit is generated based on the first digital code and the second digital code. The SAR ADC is calibrated based on the capacitor weight of the capacitor of the i-th bit.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 10A and FIG. 10B are schematic diagrams of clock signal reduction according to an embodiment of the disclosure.

DETAILED DESCRIPTION OF DISCLOSED EMBODIMENTS

An embodiment of the disclosure provides a calibration technology of a successive approximation register analog-to-digital converter (SAR ADC) based on a window switching architecture, which can effectively reduce the element size of a digital-to-analog converter (DAC) for the process limitations and the requirement to achieve higher linearity performance, and can also further reduce the dynamic power consumed due to the switching of the analog-to-digital converter (ADC). The technology combines the advantages of window switching without adding other circuits to the signal path to obtain calibrated comparator offset and flicker noise information which may influence the calibration, and may also improve the capacitor weight deviation accumulated due to calibration, so as to further improve the integral nonlinearity (INL) of the ADC.

The ADC Operation.

Figure 1:
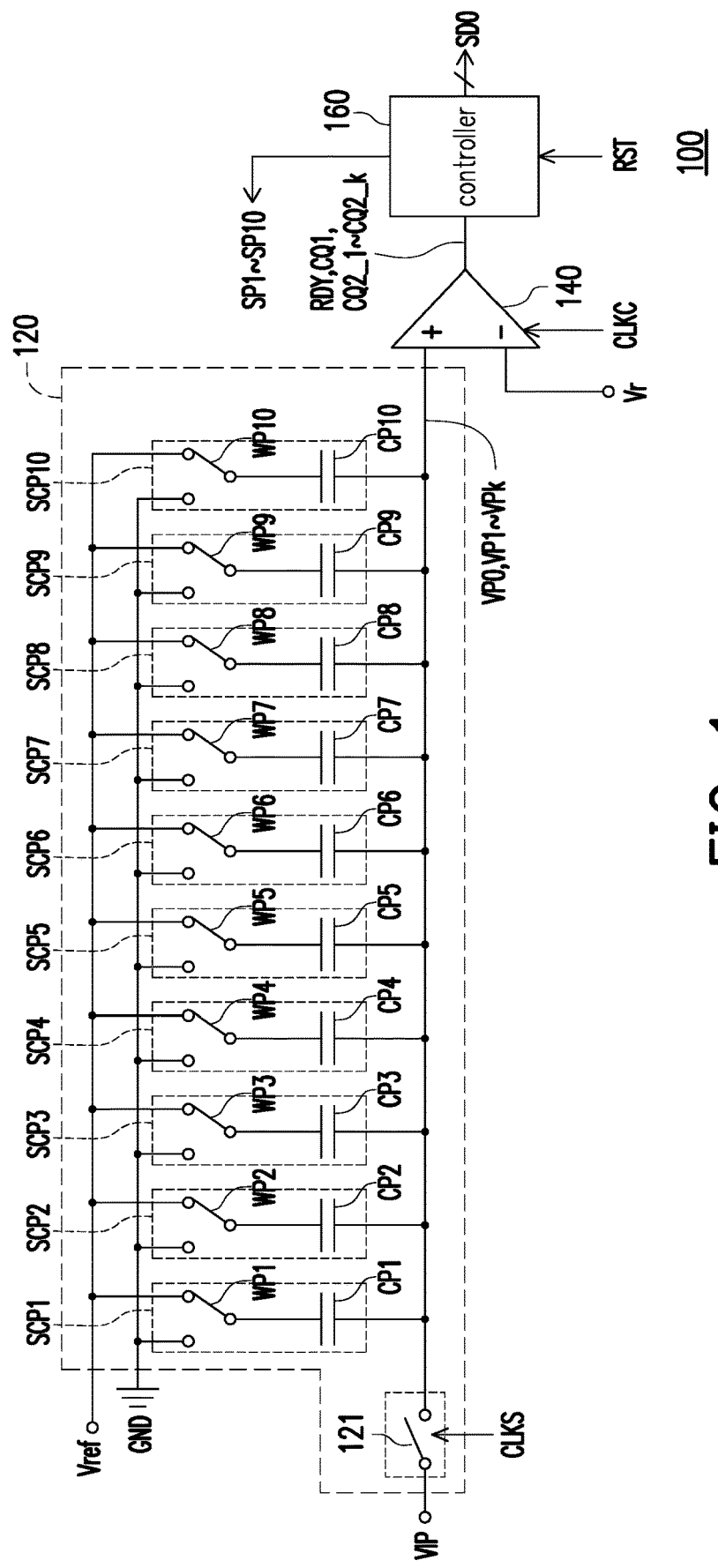
FIG. 1 is a circuit block diagram of a successive approximation register analog-to-digital converter (SAR ADC) according to an embodiment of the disclosure.

FIG. 1 is a circuit block diagram of an SAR ADC 100 according to an embodiment of the disclosure. The SAR ADC 100 is configured to convert a first analog input signal VIP to a digital output signal SDO. The digital output signal SDO has N bits from the most significant bit (MSB) to the least significant bit (LSB), where N is a positive integer. The following is illustrated with N=10.

The SAR ADC 100 may include a first capacitor digital-to-analog converter (CDAC) 120, a comparator 140, and a controller 160. The first CDAC 120 may include a sampling switch 121 and switching capacitor sets SCP1 to SCP10, which are respectively controlled by first control signals SP1 to SP10. The first CDAC 120 may receive and sample the first analog input signal VIP through the sampling switch 121 at a time point to generate a first voltage VP0. The sampling switch 121 may be, for example, a bootstrapped switch controlled by a sampling clock signal CLKS. The first CDAC 120 is controlled by multiple first control signals SP1 to SP10 to respectively control the switching operation of the switching capacitor sets SCP1 to SCP10. In detail, a switching capacitor set SCPi may include a capacitor CPi and a switch WPi, where i is an integer from 1 to L (in the example, L=10). First terminals of capacitors CP1 to CP10 are coupled to a non-inverting input terminal of the comparator 140, and second terminals of the capacitors CP1 to CP10 are switched between a reference voltage Vref and a ground voltage GND respectively through corresponding switches WP1 to WP10. The switches WP1 to WP10 are respectively controlled by the first control signals SP1 to SP10. Capacitance values of the capacitor CP1 to the capacitor CP8 are respectively twice capacitance values of the capacitor CP2 to the capacitor CP9, and the capacitance value of the capacitor CP9 is equal to the capacitance value of the capacitor CP10. In some embodiments, "coupling" may be a direct connection or an indirect connection. The indirect connection is, for example, a connection through another element. For example, if it is stated that an element A is coupled to an element B, the element A may be directly connected to the element B, or the element A may be connected to the element B through an element C. For example, the element A is directly connected to the element C, and the element C is then directly connected to the element B.

The comparator 140 receives the first voltage VP0 from the first CDAC 120 and is controlled by a comparator clock signal CLKC to compare the first voltage VP0 with a comparison reference voltage Vr, so as to generate a first comparison result CQ1. The comparison reference voltage Vr may be, for example, the reference voltage Vref. The controller 160 is coupled to the comparator 140 and the first CDAC 120. In particular, the controller 160 may generate the first control signals SP1 to SP10 based on the first comparison result CQ1 to respectively control the switching operation of the switching capacitor sets SCP1 to SCP10.

Furthermore, the controller 160 has binary window function. The controller 160 may determine the switching operation of at least one of the switching capacitor sets SCP1 to SCP10 based on the output of the comparator 140, so as to approximate the output of the first CDAC 120 to the binary window. The binary window is an M-bit window, where M is a positive integer less than or equal to N. In detail, in the k-th iteration operation (where k is less than or equal to M) among M iteration operations of the SAR ADC 100, the controller 160 may switch (for example, switch from a first state to a second state) the k-th switching capacitor set SCPk among the switching capacitor sets SCP1 to SCP10, so that the first CDAC 120 generates a corresponding second voltage VPk. Then, the comparator 140 may compare the second voltage VPk of the k-th iteration operation with the comparison reference voltage Vr to generate a corresponding second comparison result CQ2_k. The controller 160 may define (or determine) a window region WINk based on the first comparison result CQ1 and the second comparison result CQ2_k. In addition, the controller 160 may determine whether to switch the k-th switching capacitor set SCPk back to the first state or maintain the second state based on the first comparison result CQ1 and the second comparison result CQ2_k.

In the k-th iteration operation, if the first comparison result CQ1 indicates that the first voltage VP0 is greater than the comparison reference voltage Vr, and if the second comparison result CQ2_k indicates that the second voltage VPk is also greater than the comparison reference voltage Vr, the controller 160 maintains the k-th switching capacitor set in the second state (that is, the state after switching). Alternatively, in the k-th iteration operation, if the first comparison result CQ1 indicates that the first voltage VP0 is less than the comparison reference voltage Vr, and if the second comparison result CQ2_k indicates that the second voltage VPk is also less than the comparison reference voltage Vr, the controller 160 maintains the k-th switching capacitor set in the second state (that is, the state after switching).

In contrast, in the k-th iteration operation, if the first comparison result CQ1 and the second comparison result CQ2_k indicate that one of the first voltage VP0 and the second voltage VPk is greater than the reference voltage Vr, and the other one of the first voltage VP0 and the second voltage VPk is less than the comparison reference voltage Vr, the controller 160 switches the k-th switching capacitor set back to the first state (that is, the state before switching).

Figure 2:
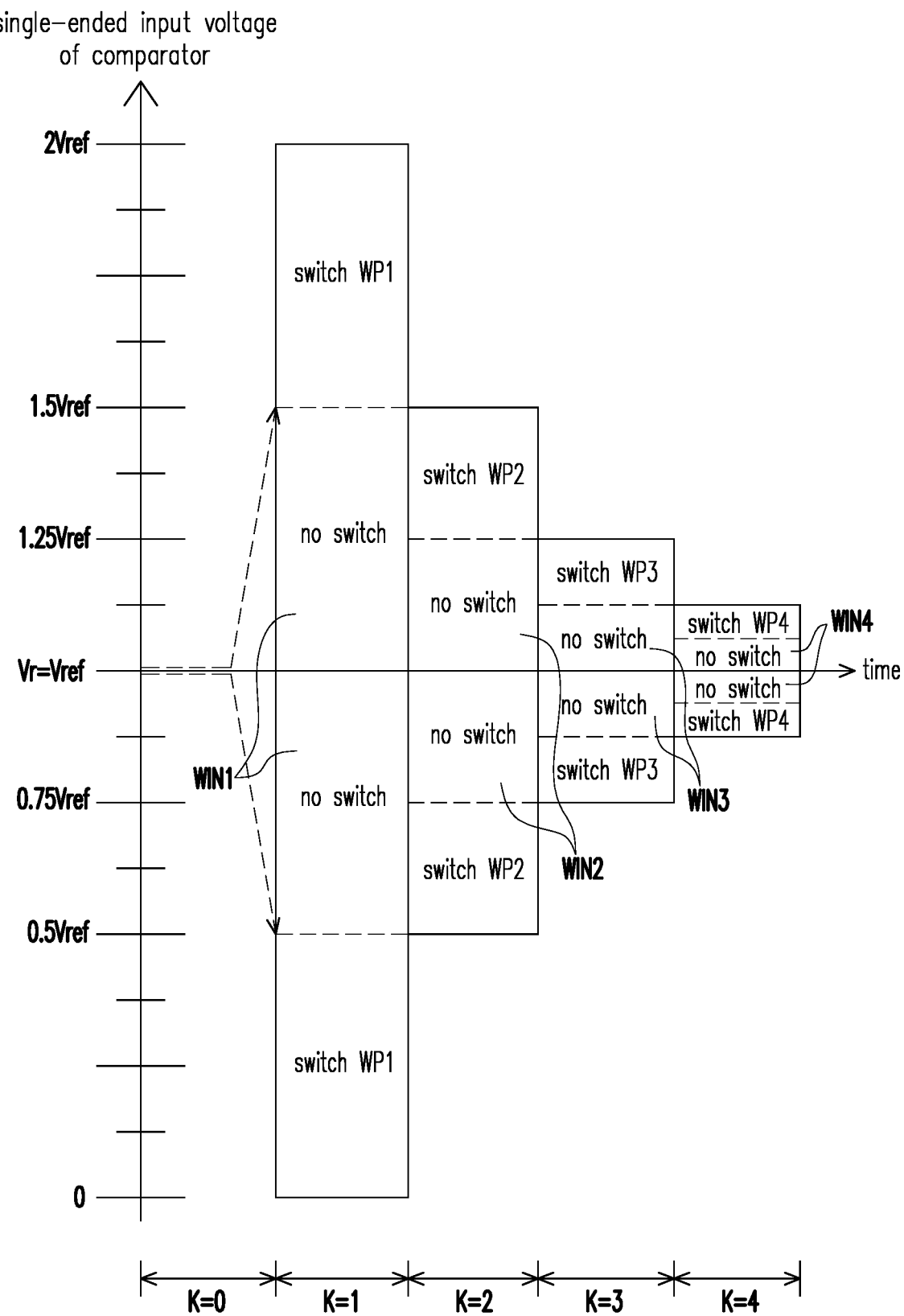
FIG. 2 is a schematic diagram of a switching mechanism of a single-ended input SAR ADC according to an embodiment of the disclosure.

FIG. 2 is a schematic diagram of a switching mechanism of a single-ended input SAR ADC when performing the binary window function according to an embodiment of the disclosure. In FIG. 2, the horizontal axis is the time and the vertical axis is the output voltage of the first CDAC 120. The following is described with M=4. Based on the binary window being a 4-bit window, in a first iteration operation (i.e. k=1) to a fourth iteration operation (i.e. k=4) of FIG. 2, four window regions WIN1 to WIN4 enclosed by dotted lines are respectively shown.

First, in a sample-and-hold operation (that is, k=0), the first CDAC 120 receives and samples the first analog input signal VIP through the sampling switch 121 to generate the first voltage VP0. In an embodiment, the amplitude of the first analog input signal VIP is, for example, equal to the reference voltage Vref, and the common mode voltage of the first analog input signal VIP is, for example, equal to the reference voltage Vref. The comparator 140 may judge whether the first voltage VP0 is greater than the comparison reference voltage Vr, thereby generating the first comparison result CQ1. Then, in the first iteration operation (i.e. k=1), the controller 160 may generate a first control signal SP1 based on the first comparison result CQ1 to control the switching operation of the switching capacitor set SCP1. The following describes the case where the first voltage VP0 is greater than the comparison reference voltage Vr.

In the sample-and-hold operation (i.e. k=0), if the first voltage VP0 is greater than the comparison reference voltage Vr, the comparator 140 may output the first comparison result CQ1, for example, logic 1. Therefore, in the first iteration operation (i.e. k=1), the controller 160 switches the switch WP1 of the switching capacitor set SCP1 to pull down the first voltage VP0, so that the first CDAC 120 generates a corresponding second voltage VP1, where VP1=VP0−(Vref/$2^k$)=VP0−(Vref/2)=VP0−(Vr/2). The reference voltage Vref in this example is the comparison reference voltage Vr, so it is assumed that Vref=Vr in the following example descriptions. Then, the comparator 140 may compare the second voltage VP1 of the first iteration operation (i.e. k=1) with the comparison reference voltage Vr to judge whether the second voltage VP1 is greater than the comparison reference voltage Vr. If the second voltage VP1 is greater than the comparison reference voltage Vr, the comparator 140 outputs a second comparison result CQ2_1, for example, logic 1. If the second voltage VP1 is greater than the reference voltage Vr, it indicates that the first voltage VP0 is greater than 1.5Vref and is located outside the window region WIN1. Therefore, the controller 160 maintains the switch WP1 of the switching capacitor set SCP1 in the state after switching, and VP1=VP0−(Vr/2) at this time. In contrast, if the second voltage VP1 is less than the comparison reference voltage Vr, the comparator 140 outputs the second comparison result CQ2_1, for example, logic 0. If the second voltage VP1 is less than the reference voltage Vr, it indicates that the first voltage VP0 is less than 1.5Vref and is located within the window region WIN1. Therefore, the controller 160 restores the switch WP1 of the switching capacitor set SCP1 to the state before switching, and VP1=VP0 at this time.

Then, in the second iteration operation (i.e. k=2), the controller 160 switches the switch WP2 of the switching capacitor set SCP2 to pull down the second voltage VP1, so that the first CDAC 120 generates the corresponding second voltage VP2, where VP2=VP1−(Vr/$2^k$)=VP1−(Vr/4). Then, the comparator 140 compares the second voltage VP2 of the second iteration operation (i.e. k=2) with the comparison reference voltage Vr to judge whether the second voltage VP2 is greater than the comparison reference voltage Vr. If the second voltage VP2 is greater than the comparison reference voltage Vr, the comparator 140 outputs a second comparison result CQ2_2, for example, logic 1. If the second voltage VP2 is greater than the reference voltage Vr, it indicates that the second voltage VP1 is greater than 1.25Vref and is located outside the window region WIN2. Therefore, the controller 160 maintains the switch WP2 of the switching capacitor set SCP2 in the state after switching, and VP2=VP1−(Vr/4) at this time. In contrast, if the second voltage VP2 is less than the comparison reference voltage Vr, the comparator 140 outputs the second comparison result CQ2_2, for example, logic 0. If the second voltage VP2 is less than the reference voltage Vr, it indicates that the second voltage VP1 is less than 1.25Vref and is located within the window region WIN2. Therefore, the controller 160 restores the switch WP2 of the switching capacitor set SCP2 to the state before switching, and VP2=VP1 at this time. The second voltage VP1 in this example is determined based on the result (i.e. the second comparison result CQ2_1) of the first iteration operation (i.e. k=1). If the second comparison result CQ2_1 is, for example, logic 1, VP1=VP0−(Vr/2). If the second comparison result CQ2_1 is, for example, logic 0, VP1=VP0.

The operation of the SAR ADC 100 in a third iteration operation (i.e. k=3) and a fourth iteration operation (i.e. k=4) may be analogized based on the descriptions of the first iteration operation (i.e. k=1) and the second iteration operation (i.e. k=2), so there will be no reiteration here.

The following describes the case where the first voltage VP0 is less than the comparison reference voltage Vr. In the sample-and-hold operation (i.e. k=0), if the first voltage VP0 is less than the comparison reference voltage Vr, the comparator 140 may output the first comparison result CQ1, for example, logic 0. Therefore, in the first iteration operation (i.e. k=1), the controller 160 switches the switch WP1 of the switching capacitor set SCP1 to pull up the first voltage VP0, so that the first CDAC 120 generates the corresponding second voltage VP1, where VP1=VP0+(Vr/$2^k$)=VP0+(Vr/2). Then, the comparator 140 may compare the second voltage VP1 of the first iteration operation (i.e. k=1) with the comparison reference voltage Vr to judge whether the second voltage VP1 is greater than the comparison reference voltage Vr. If the second voltage VP1 is greater than the comparison reference voltage Vr, the comparator 140 outputs the second comparison result CQ2_1, for example, logic 1. If the second voltage VP1 is greater than the reference voltage Vr, it indicates that the first voltage VP0 is greater than 0.5Vref and is located within the window region WIN1. Therefore, the controller 160 restores the switch WP1 of the switching capacitor set SCP1 to the state before switching, and VP1=VP0 at this time. In contrast, if the second voltage VP1 is less than the comparison reference voltage Vr, the comparator 140 outputs the second comparison result CQ2_1, for example, logic 0. If the second voltage VP1 is less than the reference voltage Vr, it indicates that the first voltage VP0 is less than 0.5Vref and is located outside the window region WIN1. Therefore, the controller 160 maintains the switch WP1 of the switching capacitor set SCP1 in the state after switching, and VP1=VP0+(Vr/2) at this time.

Then, in the second iteration operation (i.e. k=2), the controller 160 switches the switch WP2 of the switching capacitor set SCP2 to pull up the second voltage VP1, so that the first CDAC 120 generates the corresponding second voltage VP2, where VP2=VP1+(Vr/$2^k$)=VP1+(Vr/4). Then, the comparator 140 may compare the second voltage VP2 of the second iteration operation (i.e. k=2) with the comparison reference voltage Vr to judge whether the second voltage VP2 is greater than the comparison reference voltage Vr. If the second voltage VP2 is greater than the comparison reference voltage Vr, the comparator 140 outputs the second comparison result CQ2_2, for example, logic 1. If the second voltage VP2 is greater than the reference voltage Vr, it indicates that the second voltage VP1 is greater than 0.75Vref and is located within the window region WIN2. Therefore, the controller 160 restores the switch WP2 of the switching capacitor set SCP2 to the state before switching, and VP2=VP1 at this time. In contrast, if the second voltage VP2 is less than the comparison reference voltage Vr, the comparator 140 outputs the second comparison result CQ2_2, for example, logic 0. If the second voltage VP2 is less than the reference voltage Vr, it indicates that the second voltage VP1 is less than 0.75Vref and is located outside the window region WIN2. Therefore, the controller 160 maintains the switch WP2 of the switching capacitor set SCP2 in the state after switching, and VP2=VP1+(Vr/4) at this time. The second voltage VP1 here is determined based on the result (i.e. the second comparison result CQ2_1) of the first iteration (i.e. k=1). If the second comparison result CQ2_1 is, for example, logic 1, VP1=VP0. If the second comparison result CQ2_1 is, for example, logic 0, VP1=VP0+(Vr/2).

The operation of the SAR ADC 100 in the third iteration operation (i.e. k=3) and the fourth iteration operation (i.e. k=4) may be analogized based on the descriptions of the first iteration operation (i.e. k=1) and the second iteration operation (i.e. k=2).

Figure 3:
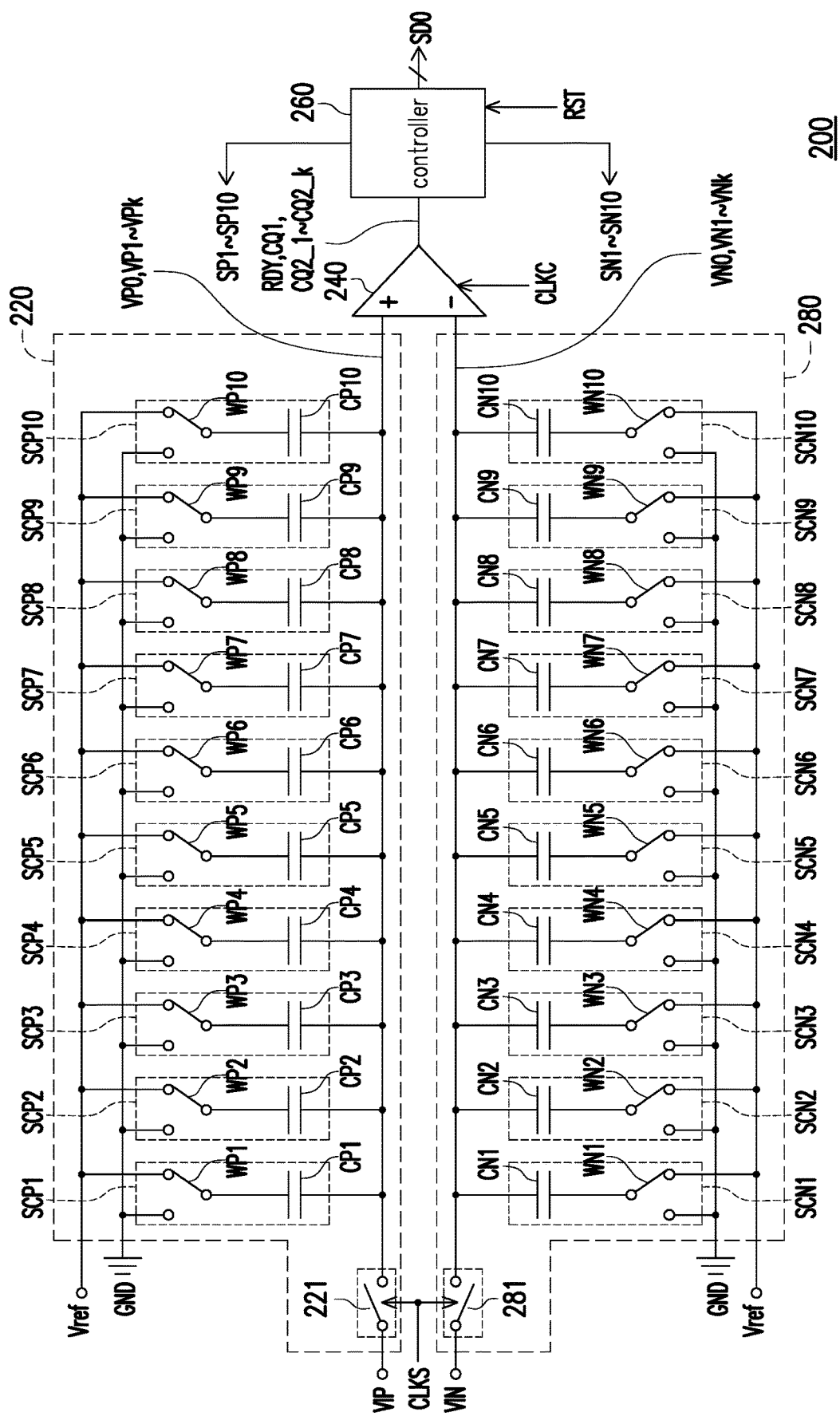
FIG. 3 is a circuit block diagram of an SAR ADC according to another embodiment of the disclosure.

FIG. 3 is a circuit block diagram of an SAR ADC 200 according to another embodiment of the disclosure. The SAR ADC 200 is a differential input ADC. The SAR ADC 200 is configured to convert a differential pair signal (including the first analog input signal VIP and a second analog input signal VIN) to a digital output signal SDO.

The SAR ADC 200 may include a first CDAC 220, a second CDAC 280, a comparator 240, and a controller 260. The architectures of the first CDAC 220, the comparator 240, and the controller 260 are respectively similar to the first CDAC 120, the comparator 140, and the controller 160 of FIG. 1, which may be analogized by referring to the relevant descriptions of FIG. 1, so there will be no reiteration here.

The second CDAC 280 may include a sampling switch 281 and switching capacitor sets SCN1 to SCN10. The second CDAC 280 may receive and sample the second analog input signal VIN through the sampling switch 281 at a time point to generate a third voltage VN0. The sampling switch 281 may be, for example, a bootstrapped switch controlled by a sampling clock signal CLKS. The second CDAC 280 is controlled by multiple second control signals SN1 to SN10 to respectively control the switching operation of the switching capacitor sets SCN1 to SCN10. In detail, a switching capacitor set SCNi may include a capacitor CNi and a switch WNi, where i is an integer from 1 to 10. First terminals of the capacitors CN1 to CN10 are coupled to an inverting input terminal of the comparator 240, and second terminals of the capacitors CN1 to CN10 are switched between the reference voltage Vref and the ground voltage GND through the switches WN1 to WN10 respectively. The switches WN1 to WN10 are respectively controlled by the second control signals SN1 to SN10. Capacitance values of the capacitor CN1 to the capacitor CN8 are respectively twice capacitance values of the capacitor CN2 to the capacitor CN9, and the capacitance value of the capacitor CN9 is equal to the capacitance value of the capacitor CN10.

In operation, the comparator 240 receives the first voltage VP0 from the first CDAC 220 and the third voltage VN0 from the second CDAC 280. The comparator 240 may be controlled by the comparator clock signal CLKC to compare the difference between the first voltage VP0 and the third voltage VN0 with a zero crossing point, so as to generate the first comparison result CQ1. In particular, the controller 260 may generate the first control signals SP1 to SP10 and the second control signals SN1 to SN10 based on the first comparison result CQ1 to respectively control the switching operation of the switching capacitor sets SCP1 to SCP10 and SCN1 to SCN10.

Furthermore, the controller 260 has binary window function. The controller 260 may, based on the output (that is, the first comparison result CQ1) of the comparator 240, determine the switching operation of at least one of the switching capacitor sets SCP1 to SCP10 and at least one of the switching capacitor sets SCN1 to SCN10 to approximate the output of the first CDAC 220 and the output of the second CDAC 280 to the binary window. The binary window is an M-bit window, where M is a positive integer less than or equal to N. In detail, in the k-th iteration operation (where k is less than or equal to M) among M iteration operations of the SAR ADC 200, the controller 260 may switch (for example, switch from the first state to the second state) the k-th switching capacitor set SCPk among the switching capacitor sets SCP1 to SCP10, so that the first CDAC 220 generates the corresponding second voltage VPk. In addition, the controller 260 may switch (for example, switch from the first state to the second state) the k-th switching capacitor set SCNk among the switching capacitor sets SCN1 to SCN10, so that the second CDAC 280 generates a corresponding fourth voltage VNk. Then, the comparator 240 may compare the difference between the second voltage VPk and the fourth voltage VNk of the k-th iteration operation with the zero crossing point (for example, 0 volt) to generate a corresponding second comparison result CQ2_k. The controller 260 may define (or determine) the window region WINk based on the first comparison result CQ1 and the second comparison result CQ2_k. In addition, the controller 260 may, based on the first comparison result CQ1 and the second comparison result CQ2_k, determine whether to switch the k-th switching capacitor set of the first CDAC 220 and the k-th switching capacitor set of the second CDAC 280 back to the first state (that is, the state before switching) or maintain the second state.

Figure 4:
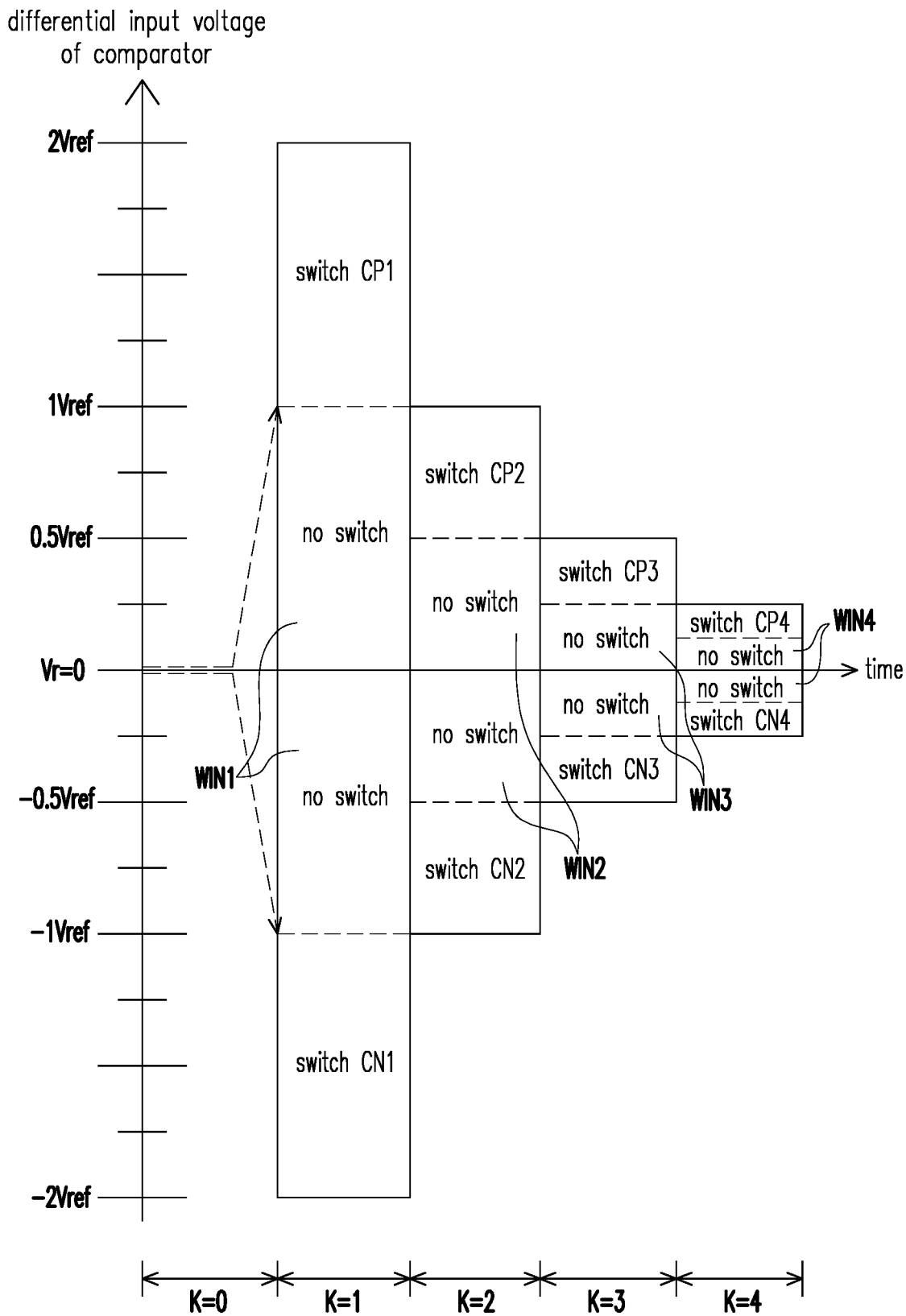
FIG. 4 is a schematic diagram of a switching mechanism of a differential input SAR ADC according to another embodiment of the disclosure.

Please refer to FIG. 3 and FIG. 4 together. FIG. 4 is a schematic diagram of a switching mechanism of a differential input SAR ADC when performing the binary window function according to an embodiment of the disclosure. The horizontal axis is the time and the vertical axis is the voltage difference between the output voltage of the first CDAC 220 and the output voltage of the second CDAC 280 (that is, the differential input voltage of the comparator 240). For ease of description, the following is illustrated with M=4 (that is, the binary window is a 4-bit window) as an example, and embodiments where M is other positive integers may be analogized based on the following descriptions. Based on the binary window being a 4-bit window, in the first iteration operation (i.e. k=1) to the fourth iteration operation (i.e. k=4) of FIG. 4, the four window regions WIN1 to WIN4 enclosed by dotted lines are respectively shown.

First, in the sample-and-hold operation (i.e. k=0), the first CDAC 220 controls a sampling switch 221 to receive and sample the first analog input signal VIP through the sampling clock signal CLKS, so as to generate the first voltage VP0. The second CDAC 280 controls a sampling switch 281 to receive and sample the second analog input signal VIN through the clock signal CLKS, so as to generate the third voltage VN0. In an embodiment, the amplitudes of the first analog input signal VIP and the second analog input signal VIN are, for example, both equal to the reference voltage Vref, and the common mode voltages of the first analog input signal VIP and the second analog input signal VIN are, for example, equal. The phase difference between the first analog input signal VIP and the second analog input signal VIN is, for example, 180 degrees. The comparator 240 is controlled by the comparator clock signal CLKC to judge whether the difference between the first voltage VP0 and the third voltage VN0 is greater than the zero crossing point, thereby generating the first comparison result CQ1. Then, in the first iteration operation (i.e. k=1), the controller 260 may generate the first control signal SP1 and a second control signal SN1 based on the first comparison result CQ1 to control the switching operations of the switching capacitor sets SCP1 and SCN1. The following is illustrated with the difference between the first voltage VP0 and the third voltage VN0 greater than the zero crossing point (i.e. VP0−VN0>0).

In the sample-and-hold operation (i.e. k=0), if the difference between the first voltage VP0 and the third voltage VN0 is greater than the zero crossing point, the comparator 240 may output the first comparison result CQ1, for example, logic 1. Therefore, in the first iteration operation (i.e. k=1), the controller 260 switches the switch WP1 of the switching capacitor set SCP1 to pull down the first voltage VP0, so that the first CDAC 220 generates the corresponding second voltage VP1, where VP1=VP0−(Vref/2). At the same time, the controller 260 switches the switch WN1 of the switching capacitor set SCN1 to pull up the third voltage VN0, so that the second CDAC 280 generates the corresponding fourth voltage VN1, where VN1=VN0+(Vref/2). Then, the comparator 240 may compare the second voltage VP1 with the fourth voltage VN1 of the first iteration operation (i.e. k=1) to judge whether the difference between the second voltage VP1 and the fourth voltage VN1 is greater than the zero crossing point. If the difference between the second voltage VP1 and the fourth voltage VN1 is greater than the zero crossing point, the comparator 240 outputs the second comparison result CQ2_1, for example, logic 1. If the difference between the second voltage VP1 and the fourth voltage VN1 is greater than the zero crossing point, it indicates that the difference between the first voltage VP0 and the third voltage VN0 is greater than Vref and is located outside the window region WIN1. Therefore, the controller 260 maintains the switch WP1 of the switching capacitor set SCP1 and the switch WN1 of the switching capacitor set SCN1 in the state after switching. At this time, the difference between the second voltage VP1 and the fourth voltage VN1 is VP1−VN1=[VP0−(Vref/2)]−[VN0+(Vref/2)]=(VP0−VN0)−Vref. In contrast, if the difference between the second voltage VP1 and the fourth voltage VN1 is less than the zero crossing point, the comparator 240 outputs the second comparison result CQ2_1, for example, logic 0. If the difference between the second voltage VP1 and the fourth voltage VN1 is less than the zero crossing point, it indicates that the difference between the first voltage VP0 and the third voltage VN0 is less than Vref and is located within the window region WIN1. Therefore, the controller 260 restores the switch WP1 of the switching capacitor set SCP1 and the switch WN1 of the switching capacitor set SCN1 to the state before switching. At this time, the difference between the second voltage VP1 and the fourth voltage VN1 is VP1−VN1=VP0−VN0.

Then, in the second iteration operation (i.e. k=2), the controller 260 switches the switch WP2 of the switching capacitor set SCP2 to pull down the second voltage VP1, so that the first CDAC 220 generates the corresponding second voltage VP2, where VP2=VP1−(Vref/4). At the same time, the controller 260 switches the switch WN2 of the switching capacitor set SCN2 to pull up the fourth voltage VN1, so that the second CDAC 280 generates the corresponding fourth voltage VN2, where VN2=VN1+(Vref/4). Then, the comparator 240 may compare the second voltage VP2 with the fourth voltage VN2 of the second iteration operation (i.e. k=2) to judge whether the difference between the second voltage VP2 and the fourth voltage VN2 is greater than the zero crossing point. If the difference between the second voltage VP2 and the fourth voltage VN2 is greater than the zero crossing point, the comparator 240 outputs the second comparison result CQ2_2, for example, logic 1. If the difference between the second voltage VP2 and the fourth voltage VN2 is greater than the zero crossing point, it indicates that the difference between the second voltage VP1 and the fourth voltage VN1 is greater than 0.5Vref and is located outside the window region WIN2. Therefore, the controller 260 maintains the switch WP2 of the switching capacitor set SCP2 and the switch WN2 of the switching capacitor set SCN2 in the state after switching, and VP2−VN2=[VP1−(Vref/4)]−[VN1+(Vref/4)]=(VP1−VN1)−0.5Vref at this time. In contrast, if the difference between the second voltage VP2 and the fourth voltage VN2 is less than the zero crossing point, the comparator 240 outputs the second comparison result CQ2_2, for example, logic 0. If the difference between the second voltage VP2 and the fourth voltage VN2 is less than the zero crossing point, it indicates that the difference between the second voltage VP1 and the fourth voltage VN1 is less than 0.5Vref and is located within the window region WIN2. Therefore, the controller 260 restores the switch WP2 of the switching capacitor set SCP2 and the switch WN2 of the switching capacitor set SCN2 to the state before switching, and VP2−VN2=(VP1−VN1) at this time.

The switching operations of the first CDAC 220 and the second CDAC 280 in the third iteration operation (i.e. k=3) and the fourth iteration operation (i.e. k=4) respectively may be analogized based on the descriptions of the first iteration operation (i.e. k=1) and the second iteration operation (i.e.

k=2), so there will be no reiteration here. In the case where the difference between the first voltage VP0 and the third voltage VN0 is greater than the zero crossing point, the controller controls the switching operations of the first CDAC 220 and the second CDAC 280 based on the first comparison result CQ1 and the second comparison result CQ2_$k$. On the other hand, when the difference between the first voltage VP0 and the third voltage VN0 is less than the zero crossing point, the controller 260 controls the switching operations of the first CDAC 220 and the second CDAC 280 based on the first comparison result CQ1 and the second comparison result CQ2_$k$. The detailed operations may be analogized by referring to the above descriptions, so there will be no reiteration.

The Calibration Method.

In an embodiment, the ADC performs normal operation of analog-to-digital conversion in the operation mode and performs calibration in the calibration mode. In an embodiment, before the operation mode is performed, the calibration mode may be performed first. In an embodiment, the calibration mode may be performed after performing the operation mode for a period of time. In an embodiment, the calibration mode may be (periodically) performed each time after performing the operation mode for a period of time. Next, the capacitor calibration method according to embodiments of the disclosure will be described. Here, the circuit architecture illustrated in FIG. 3 is used as an illustrative example. In the example architecture, in order to focus on the capacitor calibration part, the circuit diagram is slightly simplified. In the example, taking 11 capacitors as an example. Capacitors CP1 to CP5 and CN1 to CN5 are capacitors to be calibrated, and capacitors CP6 to CP11 and CN6 to CN11 are accurate capacitors. In implementation, each capacitor may include a group of capacitors. For example, the capacitors CP1 and CN1 may each include 8 smaller capacitors, and the capacitors CP2 and CN2 may each include 4 smaller capacitors, which are not limited by the disclosure. When manufacturing the capacitors CP6 to CP11 and CN6 to CN11, the required accuracy may be achieved through required process parameters. In an embodiment, without adding additional circuits, the accurate capacitors are used as references to calibrate the less accurate capacitors. In the embodiment, the accurate capacitors CP6 to CP11 and CN6 to CN11 are used to calibrate the less accurate capacitors CP1 to CP5 and CN1 to CN5.

Figure 5:
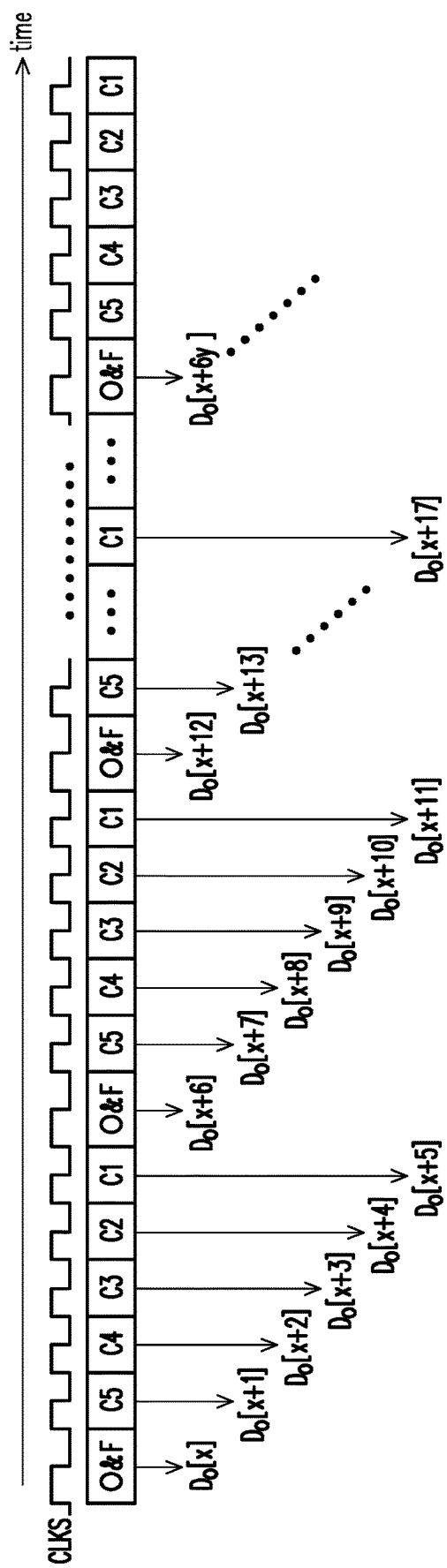
FIG. 5 is a timing diagram of calibration according to an embodiment of the disclosure.

FIG. 5 is a timing diagram of calibration according to an embodiment of the disclosure. In the embodiment of the disclosure, the calibration process may be performed multiple times, and the calibration value becomes more accurate due to the multiple calibrations of the flicker noise and the comparator offset and the average value of the capacitors C1 to C5. As shown in FIG. 5, the calibration sequence in each calibration cycle is to first calibrate the flicker noise and the comparator offset (i.e. O & F in the drawing, which are both referred to as noise), and then calibrate the capacitors CP5 to CP1 and CN5 to CN1. In an embodiment, the flicker noise and the comparator offset are calibrated in the first cycle of a sampling clock CLKS, and the capacitors CP5 to CP1 and CN5 to CN1 are respectively calibrated in the second cycle to the sixth cycle of the sampling clock CLKS. Information Do[x] of the comparator offset and the flicker noise are obtained in the first cycle of the sampling clock CLKS, and the capacitors CP5 to CP1 and CN5 to CN1 are then calibrated in sequence at each sampling clock CLKS to respectively obtain calibration information Do[x+1] to Do[x+5]. Do[x] is a binary digital code output by the ADC, where x represents each calibration cycle and is a positive integer, and y represents the number of repetitions of a calibration procedure and is a natural number. Similarly, the calibration procedure is continuously repeated. For example, calibration information Do[x+6] to Do[x+11] of the comparator offset and the flicker noise and the capacitors CP5 to CP1 and CN5 to CN1 may be obtained in the seventh to the twelfth cycle of the sampling clock CLKS. By analogy, the overall calibration procedure will continue for several cycles for averaging.

Then, the calibration method is explained together with the circuit structure. The calibration of the flicker noise and the comparator offset, the capacitors CP5 and CN5, and the capacitors CP1 and CN1 will be used for explanation. The calibration method of the capacitors CP4 and CN4 to the capacitors CP2 and CN2 is similar to the calibration method of the capacitors CP5 and CP1 and the capacitors CN5 and CN1.

Figure 6:
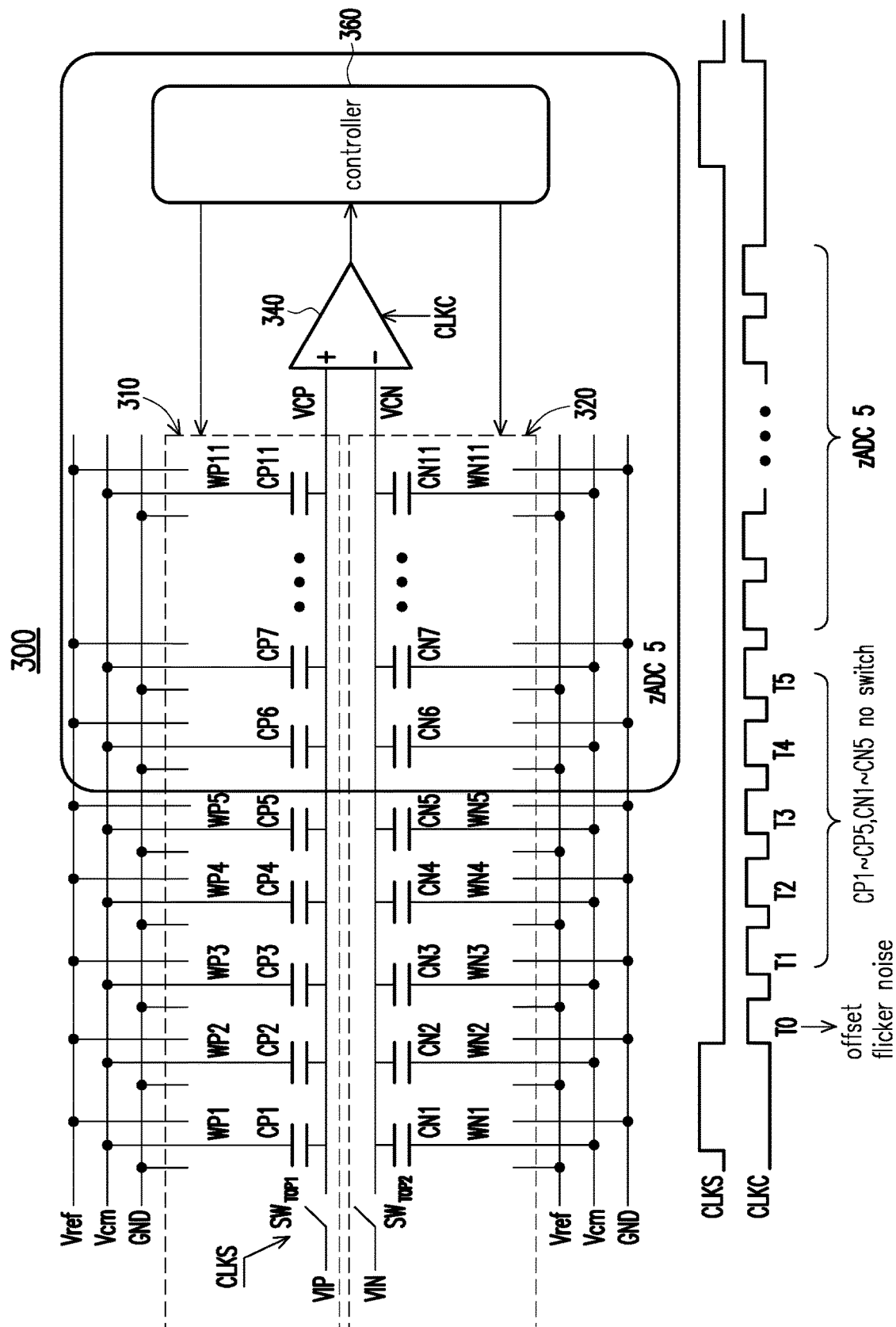
FIG. 6 is a schematic diagram of calibration of flicker noise and comparator offset according to an embodiment of the disclosure.
Figure 7:
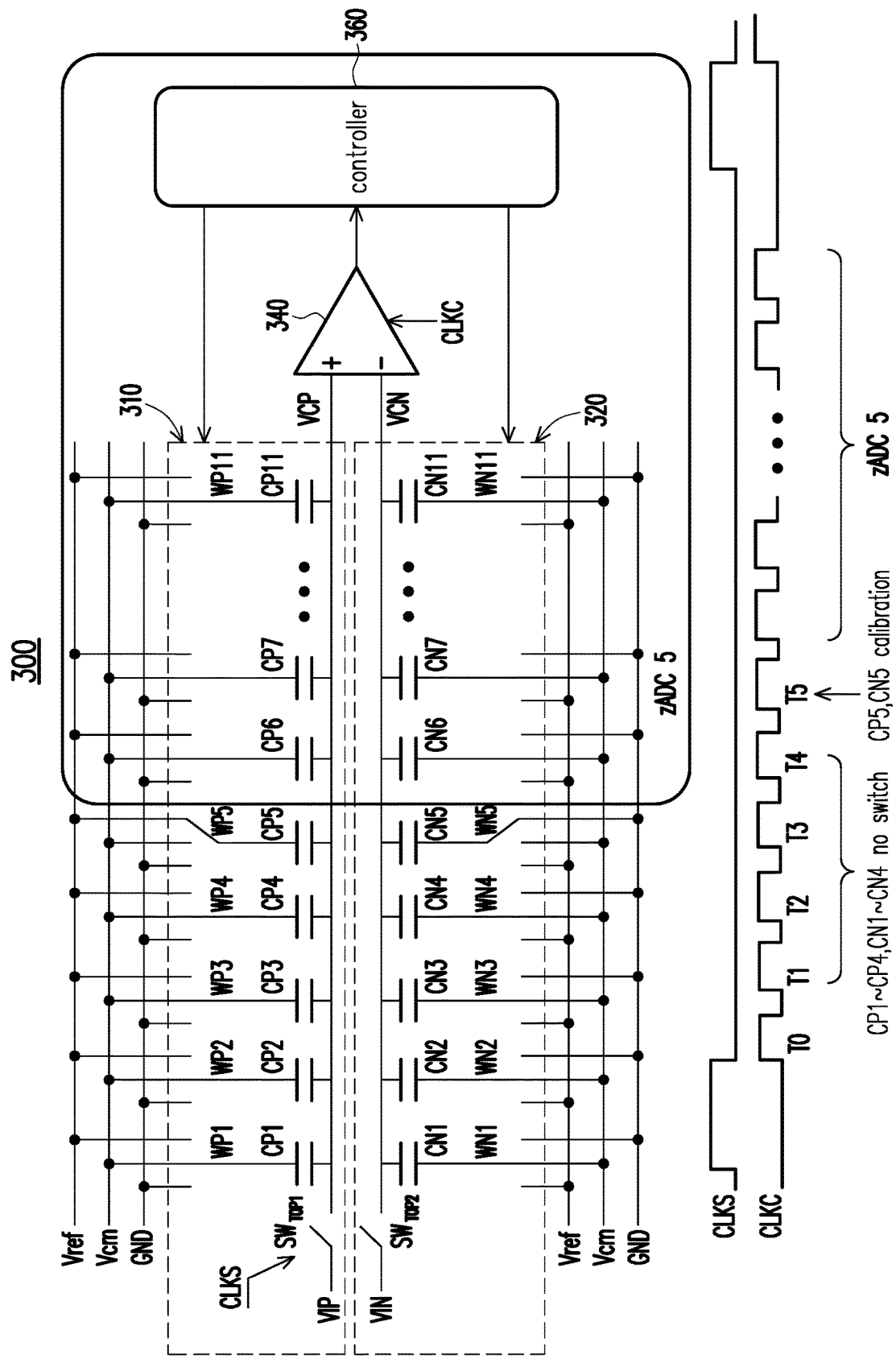
FIG. 7 is a schematic diagram of capacitor calibration according to an embodiment of the disclosure.
Figure 8:
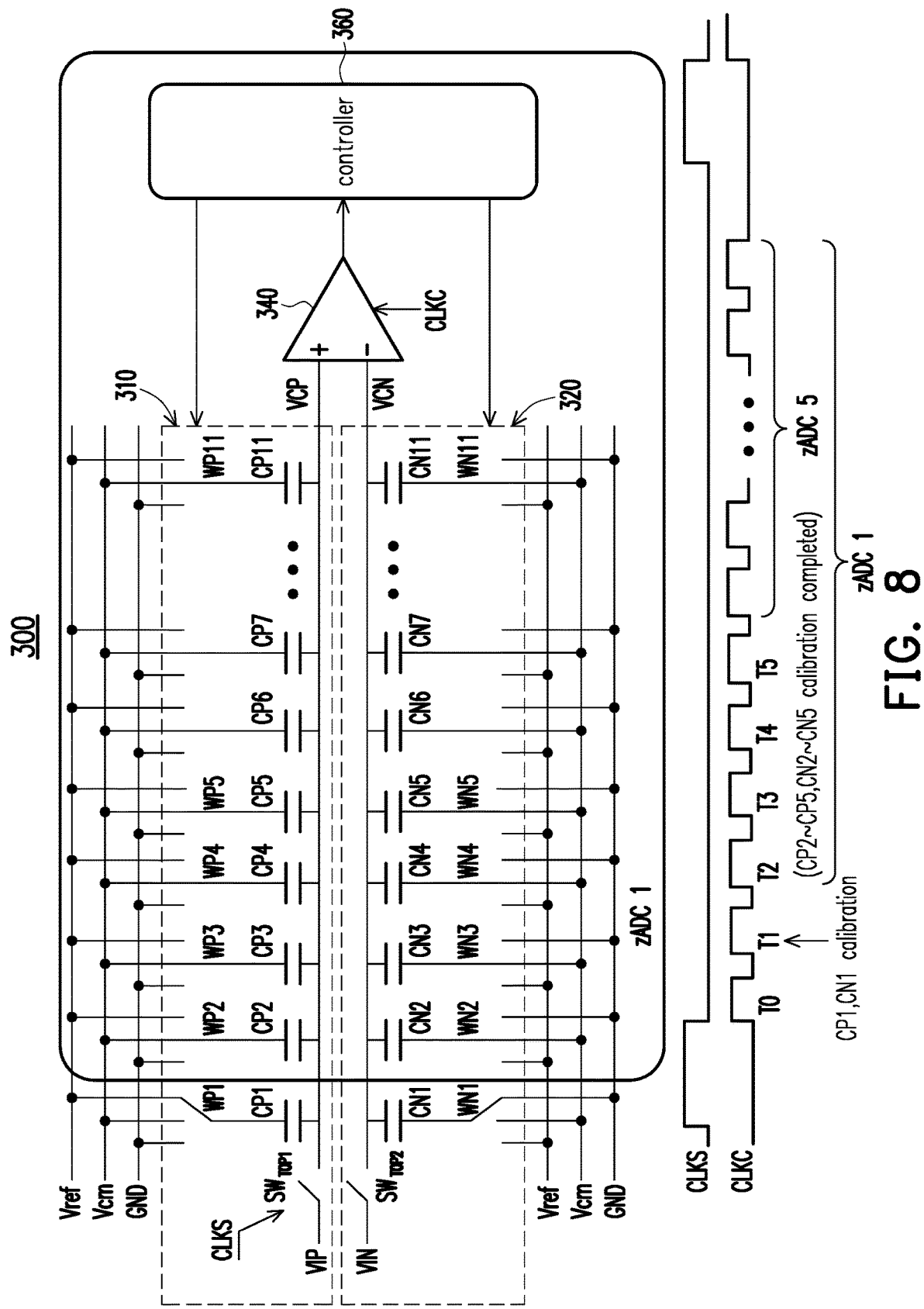
FIG. 8 is a schematic diagram of capacitor calibration according to an embodiment of the disclosure.

Next, FIG. 6 to FIG. 8 illustrate the capacitor calibration method according to embodiments of the disclosure. FIG. 6 is a schematic diagram of calibration of flicker noise and offset of a comparator 340 according to an embodiment of the disclosure.

As shown in FIG. 6, an SAR ADC converter 300 may include a first CDAC 310, a second CDAC 320, the comparator 340, and a controller 360. Outputs VCP and VCN of the first CDAC 310 and the second CDAC 320 are respectively connected to two input terminals of the comparator 340. Capacitors CP1 and CN1 correspond to the MSB, and the following are capacitors CP2 and CN2, capacitors CP3 and CN4, . . . in sequence, but the disclosure is not limited thereto. The comparison result output by the comparator 340 is then sent to the controller 360. In an embodiment, the controller 360 performs the control of the analog-to-digital conversion described in FIG. 1 to FIG. 4, and/or performs the control such as capacitor calibration and quantization of the flicker noise and the offset of the comparator 360.

First, the flicker noise and the offset of the comparator 340 are calibrated. As shown in FIG. 6, when the sampling clock CLKS is at high voltage, connect switches $SW_{TOP1}$ and $SW_{TOP2}$ of first terminals (or top plate) of the capacitors CP1 to CP11 and CN1 to CN11 are connected. At this time, the first terminals of the capacitors CP1 to CP11 of the first CDAC 310 are all connected to the first input voltage VIP via the switch $SW_{TOP1}$, and the first terminals of the capacitors CN1 to CN11 of the second CDAC 320 are all connected to the second input voltage VIN via the switch $SW_{TOP2}$. In an embodiment, the voltages of the first input voltage VIP and the second input voltage VIN are arbitrary voltage values, and the arbitrary voltage values are determined based on an input common mode voltage Vicm of the comparator. In an embodiment, the voltage values of the first input voltage VIP and the second input voltage VIN are the input common mode voltage Vicm, and second terminals (or bottom plate) of the capacitors CP1 to CP11 and CN1 to CN11 are respectively switched to a first reference voltage Vcm by the switches WP1 to WP11 and WN1 to WN11, so as to reset all the capacitors CP1 to CP11 and CN1 to CN11. In an embodiment, the voltage of the first input voltage VIP and the second input voltage VIN is Vcm, and the second terminals of the capacitors CP1 to CP11 and the capacitors CN1 to CN11 are switched to the input common mode voltage Vicm or other voltages by the switches WP1 to WP11 and the switches WN1 to WN11, so as to reset all the capacitors CP1 to CP11 and CN1 to CN11. In an embodiment, the input common mode voltage Vicm of the operation mode is (VIP+VIN)/2. In an embodiment, the first reference voltage Vcm may be the input common mode voltage Vicm.

In an embodiment, when the capacitors CP1 to CP11 and the capacitors CN1 to CN11 are reset, the voltages of the first terminals and the second terminals of the capacitors CP1 to CP11 and the capacitors CN1 to CN11 may be the same.

When the sampling clock CLKS is switched to low voltage, the controller 360 disconnects the switches $SW_{TOP1}$ and $SW_{TOP2}$, so that the first terminals of the capacitors CP1 to CP11 and the capacitors CN1 to CN11 are disconnected from the first input voltage VIP and the second input voltage VIN, and all the second terminals of the capacitors CP1 to CP5 and the capacitors CN1 to CN5 (that is, the capacitors to be calibrated) are maintained at the first reference voltage Vcm respectively by the switches WP1 to WP5 and the switches WN1 to WN5. After the sampling clock CLKS is switched from the high voltage to the low voltage, the calibration procedure is performed. In a cycle T0 of the comparator clock CLKC, calibration of offset and flicker noise begin. In an embodiment, in cycles T1 to T5 of the comparator clock CLKC, the switches WP1 to WP5 of the capacitors CP1 to CP5 and the switches WN1 to WN5 of the capacitors CN1 to CN5 are not switched. After the 5 cycles (T1 to T5) of the comparator clock CLKC, the accurate capacitors CP6 to CP11 of the first CDAC 310 and the accurate capacitors CN6 to CN11 of the second CDAC 320 (zADC 5 as shown in FIG. 6) perform the digital-to-analog conversion of the SAR ADC 300. When performing the digital-to-analog conversion of the SAR ADC 300, the second terminals of the capacitors CP6 to CP11 and the capacitors CN6 to CN11 do not need to be connected to the first reference voltage Vcm and may be connected to a second reference voltage Vref or a third reference voltage GND based on the operation of the SAR ADC 300. In an embodiment, zADC is a corresponding ADC including the accurate capacitors and/or calibrated capacitors. The switching of the corresponding capacitor is determined by the result of each bit of the zADC 5, that is, performing the binary search method of the SAR ADC 300. If the result of the comparator 340 under one bit is 1, it represents that the capacitor of the VCP side of the bit is switched from the Vcm to the GND by the switch of the second terminal, and the capacitor of the VCN side is switched from the first reference voltage Vcm to the second reference voltage Vref by the switch of the second terminal. On the contrary, if the result of the comparator 340 under one bit is 0, it represents that the capacitor of the VCP side of the bit is switched from the first reference voltage Vcm to the second reference voltage Vref by the switch of the second terminal, and the capacitor of the VCN side is switched from the first reference voltage Vcm to the third reference voltage GND by the switch of the second terminal. In this way, after switching, the next bit is compared until all bits are converted. The binary output of seven digital bits obtained by the zADC 5 is the information of the flicker noise and the offset of the comparator 340. In this embodiment, all accurate capacitors are used to measure the information of the flicker noise and the offset of the comparator 340, but the disclosure is not limited thereto. In an embodiment, some of the accurate capacitors may be used to measure the information of the flicker noise and the offset of the comparator 340. For example, the information of the flicker noise and the offset of the comparator 340 may be measured using the corresponding ADC of several capacitors of lower bits including the LSB. Specifically, for example, CP7 to CP11 and CN7 to CN11 may be used for measurement, and the measurement method is similar to the above. For example, after the sampling clock CLKS is switched from the high voltage to the low voltage, the calibration procedure is performed. In the cycle T0 of the comparator clock CLKC, the calibration of the offset and the flicker noise begin. In the cycles T1 to T5 of the comparator clock CLKC, the switches WP1 to WP6 of the capacitors CP1 to CP6 and the switches WN1 to WN6 of the capacitors CN1 to CN6 are not switched. After the 6 cycles (T1 to T6, T6 is not shown, and T6 is the next cycle of T5) of the comparator clock CLKC, the accurate capacitors CP7 to CP11 of the first CDAC 310 and the accurate capacitors CN7 to CN11 of the second CDAC 320 performs the digital-to-analog conversion of the SAR ADC 300. When performing the digital-to-analog conversion of the SAR ADC 300, the second terminals of the capacitors CP7 to CP11 and the capacitors CN7 to CN11 do not need to be connected to the first reference voltage Vcm and may be connected to the second reference voltage Vref or the third reference voltage GND based on the operation of the SAR ADC 300. The obtained binary output of six digital bits is the information of the flicker noise and the offset of the comparator 340. The high voltage and the low voltages in this embodiment are for illustration only. In another embodiment, the capacitor reset may also be performed when the sampling clock CLKS is at low voltage, and the calibration may be performed when the sampling clock CLKS is at high voltage, which are not limited by the disclosure.

After the flicker noise and the offset of the comparator 340 are quantified, the calibration procedure of the capacitors CP1 to CP5 and the capacitors CN1 to CN5 of the first CDAC 310 and the second CDAC 320 is performed. In an embodiment, the capacitor calibration begins from the capacitor with the smallest bit among the capacitors to be calibrated. In the embodiment, the capacitor calibration begins from the capacitor CP5 and the capacitor CN5, that is, the capacitors whose bit ordering is closest to the accurate capacitors CP6 to CP11 and capacitors CN6 to CN11.

FIG. 7 is a schematic diagram of capacitor calibration according to an embodiment of the disclosure. The following embodiment illustrates the calibration of the capacitors CP5 and CN5. As shown in FIG. 7, when the sampling clock CLKS is at the high voltage, the first terminals of the capacitors CP1 to CP11 of the first CDAC 310 are all connected to the first input voltage VIP via the switch $SW_{TOP1}$, and the first terminals of the capacitors CN1 to CN11 of the second CDAC 320 are all connected to second input voltage VIN via the switch $SW_{TOP2}$. In an embodiment, the voltages of the first input voltage VIP and the second input voltage VIN are the input common mode voltage Vicm, and the second terminals of the capacitors CP1 to CP11 and the capacitors CN1 to CN11 are switched to the Vcm by the switches WP1 to WP11 and WN1 to WN11, so as to reset all the capacitors CP1 to CP11 and CN1 to CN11.

After the sampling clock CLKS is switched to the low voltage, in the cycles T0 to T4 of the comparator clock CLKC, the corresponding second terminals of the capacitors CP1 to CP4 and the capacitors CN1 to CN4 of the first CDAC 310 and the second CDAC 320 are all maintained at the first reference voltage Vcm respectively via the switches WP1 to WP4 and the switches WN1 to WN4, and the $SW_{TOP1}$ and $SW_{TOP2}$ are disconnected respectively from corresponding to the first CDAC 310 and the second CDAC 320. In the cycles T0 to T4 of the comparator clock CLKC, the comparator 340 may perform the comparison, but does not switch the voltages of the second terminals of the capacitors. In an embodiment, the switching control signal generated by the controller 360 may be blocked through the logic circuits inside the controller 360, so that the switches WP1 to WP4 of the capacitors CP1 to CP4 and the switches WN1 to WN4 of the capacitors CN1 to CN4 are not switched during the period T1 to T4.

Then, in the cycle T5 of the comparator clock CLKC, the calibration of the capacitors CP5 and CN5 begins. At this time, the second terminal of the capacitor CP5 of the first CDAC 310 is connected to the second reference voltage Vref (reference voltage) through the switch WP5, and the second terminal of the capacitor CN5 of the second CDAC 320 is connected to the third reference voltage GND (ground voltage) through the switch WN5. Next, after the cycle T5 of the comparator clock CLKC, the zADC 5 corresponding to the capacitors CP6 to CP11 and CN6 to CN11 performs the analog-to-digital conversion.

As mentioned earlier, the capacitors CP6 to CP11 of the first CDAC 310 and the capacitors CN6 to CN11 of the second CDAC 320 may be accurately manufactured through requesting process parameters. Therefore, an accurate result may be obtained by the zADC 5 corresponding to the CP6 to CP11 and the CN6 to CN11 performing the analog-to-digital conversion to calibrate the capacitors CP5 and CN5.

In an embodiment, the result obtained by the analog-to-digital conversion performed by the zADC 5 contains the flicker noise and the offset of the comparator 340. In an embodiment, the result obtained by the analog-to-digital conversion performed by the zADC 5 is deducted by the flicker noise and the offset of the comparator 340 (for example, the flicker noise and the offset of the comparator 340 obtained above) to obtain a capacitor weight $W_{C5}$ of the capacitor CP5 and/or the capacitor CN5. In an embodiment, such as the differential circuit shown in FIG. 7, the capacitor weight $W_{C5}$ is the weight of the bit corresponding to the capacitor CP5 and the capacitor CN5. In another embodiment, such as the single-ended circuit shown in FIG. 1, the capacitor weight $W_{C5}$ is the weight of the bits corresponding to the capacitor CP5. In another embodiment, the capacitor weight $W_{C5}$ is the weight of the bits corresponding to the capacitor CN5. Capacitor weights $W_{C1}$ to $W_{C4}$ are similar to the capacitor weight $W_{C5}$ and may be analogized.

FIG. 8 is a schematic diagram of capacitor calibration according to an embodiment of the disclosure. The following embodiment illustrates the calibration of the capacitors CP1 and CN1. As shown in FIG. 8, when the sampling clock CLKS is at the high voltage, the first terminals of the capacitors CP1 to CP11 of the first CDAC 310 are all connected to the first input voltage VIP via the switch $SW_{TOP1}$, and the first terminals of the capacitors CN1 to CN11 of the second CDAC 320 are all connected to the second input voltage VIN via the switch $SW_{TOP2}$. In an embodiment, the voltages of the first input voltage VIP and the second input voltage VIN are the input common mode voltage Vicm, and the second terminals of the capacitors CP1 to CP11 and the capacitors CN1 to CN11 are switched to the Vcm respectively by the switches WP1 to WP11 and the switches WN1 to WN11, so as to reset all the capacitors CP1 to CP11 and CN1 to CN11.

After the sampling clock CLKS is switched to the low voltage, the $SW_{TOP1}$ and $SW_{TOP2}$ respectively corresponding to the first CDAC 310 and the second CDAC 320 are both disconnected. In the cycle T0 of the comparator clock CLKC, the comparator 340 may perform the comparison, but does not switch the voltages of the second terminals of the capacitors. In the cycle T1 of the comparator clock CLKC, the calibration of the capacitors CP1 and CN1 is performed. At this time, the second terminal of the capacitor CP1 of the first CDAC 310 is connected to the second reference voltage Vref (reference voltage) through the switch WP1, and the second terminal of the capacitor CN1 of the second CDAC 320 is connected to the third reference voltage GND (ground voltage) through the switch WN1. After the cycle T1 of the comparator clock CLKC, the analog-to-digital conversion is performed using a zADC 1 (including the SAR ADC corresponding to the calibrated capacitors CP2 to CP5 and CN2 to CN5 and the accurate capacitors CP6 to CP11 and CN6 to CN11). The voltage of the second terminal of the capacitor corresponding to each bit is switched according to the comparison result of each bit of the zADC 1. The obtained binary output of eleven digital bits is the weights of the capacitors CP1 and CN1. In an embodiment, the result obtained by the zADC 1 performing the analog-to-digital conversion contains the flicker noise and the offset of the comparator 340. The weights of the capacitors CP1 and CN1 obtained by the zADC 1 performing the analog-to-digital conversion is deducted by the flicker noise and the offset of the comparator 340 (for example, the flicker noise and the offset of the comparator 340 obtained above) to obtain the capacitor weight $W_{C1}$ of the capacitors CP1 and CN1.

As mentioned above, the capacitors CP6 to CP11 of the first CDAC 310 and the capacitors CN6 to CN11 of the second CDAC 320 are accurate capacitors, and the capacitors CP2 to CP5 and CN2 to CN5 have also been calibrated. When the capacitors CP2 to CP11 and CN2 to CN11 of the zADC 1 perform general successive approximation analog-to-digital conversion, the capacitors CP1 and CN1 may be calibrated. The weight of the capacitors CP1 and CN1 obtained contains the flicker noise and the offset of the comparator 340, so the flicker noise and the offset of the comparator 340 may be deducted to obtain the capacitor weight $W_{C1}$ of the capacitors CP1 and CN1.

Similar to the above method, the capacitor weights of the capacitors CP2 to CP4 of the first CDAC 310 and the capacitors CN2 to CN4 of the second CDAC 320 may be calibrated. Taking the calibration of the capacitors CP4 and CN4 as an example, when the sampling clock CLKS is at the high voltage, the capacitors CP1 to CP11 and CN1 to CN11 are reset. When the sampling clock CLKS is at the low voltage and during the cycles T0 to T3 of the comparator clock CLKC, the $SW_{TOP1}$ and $SW_{TOP2}$ are disconnected. In the cycle T4 of the comparator clock CLKC, the second terminals of the capacitors CP1 to CP3 and CN1 to CN3 are maintained at the first reference voltage Vcm, the second terminal of the capacitor CP4 of the first CDAC 310 is switched to the second reference voltage Vref through the switch WP4, and the second terminal of the capacitor CN4 of the second CDAC 320 is switched to the third reference voltage GND through the switch WN4. In the cycle T4 of the comparator clock CLKC, the capacitors CP4 and CN4 begin to be calibrated. The general successive approximation analog-to-digital conversion is performed using a zADC4 (containing the SAR ADC corresponding to the calibrated capacitors CP5 and CN5 and the accurate capacitors CP6 to CP11 and CN6 to CN11). The flicker noise and the offset of the comparator 340 are then deducted to obtain the capacitor weight $W_{C4}$ of the capacitors CP4 and CN4. The calibration method of the capacitors CP2 and CN2, and CP3 and CN3 is similar to the above and may be analogized.

In an embodiment, the timing of the calibration procedure of the SAR ADC 300 in the calibration mode is the same as or similar to the timing in the operation mode, so there is no need to add or change the circuit to achieve the calibration of capacitors and the measurements of the flicker noise and the offset of the comparator 340.

In an embodiment, after the capacitor weight of each capacitor is obtained, the capacitor weights may be used to correct the digital codes output by the first CDAC 310 and/or the second CDAC 320, so as to obtain the accurate digital codes. In an embodiment, due to the inaccuracy of the capacitor, the digital codes output by the first CDAC 310 and/or the second CDAC 320 may deviate from the correct digital codes. After obtaining the capacitor weight of each capacitor, a redundant circuit (not shown) may be used to correct the deviation, so as to obtain the correct digital codes. In an embodiment, the flicker noise and the offset of the comparator 340 may be quantified.

In the following, another embodiment is used to illustrate the calculation manner of the capacitor weights $W_{C1}$ to $W_{C5}$ of the capacitors CP1 to CP5 and the capacitors CN1 to CN5. As mentioned earlier, in the circuit architecture examples shown in FIG. 6 to FIG. 8, one of the calibration procedures is to use 6 cycles of the sampling clock CLKS. The calibration of the flicker noise, the comparator offset, and the capacitors CP5 to CP1 and the capacitors CN5 to CN1 is respectively performed during the six cycles. In an implementation, the calibration procedure may be executed multiple times, and the calibration values obtained each time are averaged to obtain more accurate capacitor calibration values. As shown in FIG. 5, after the above procedure is performed y times, average weights $W_{C1avg}$ to $W_{C5avg}$ of the capacitors CP5 to CP1 and CN5 to CN1 may be obtained by calculating Equation (1). $W_{C1avg}$ is the average weight of the capacitors CP1 and CN1, and $D_0[x+6y]$ is the flicker noise and the offset of the comparator 340 obtained at the (y+1)-th time, where x represents each calibration cycle and is a positive integer, and y represents the number of repetitions of a calibration procedure and is a natural number. Through performing multiple calibration procedures, the influence of white noise on the capacitor calibration weight may be eliminated. $D_0[(x+1)+6y]$ to $D_0[(x+5)+6y]$, $D_0[x+6y]$, etc. are the binary digital codes obtained by the operation of the SAR ADC 300 in each calibration cycle.

$$W_{C5avg} = \frac{1}{N}\sum_{n=0}^{N} D_0[(x+1)+6y] - D_0[x+6y] \quad (1)$$

$$W_{C4avg} = \frac{1}{N}\sum_{n=0}^{N} D_0[(x+2)+6y] - D_0[x+6y]$$

$$W_{C3avg} = \frac{1}{N}\sum_{n=0}^{N} D_0[(x+3)+6y] - D_0[x+6y]$$

$$W_{C2avg} = \frac{1}{N}\sum_{n=0}^{N} D_0[(x+4)+6y] - D_0[x+6y]$$

$$W_{C1avg} = \frac{1}{N}\sum_{n=0}^{N} D_0[(x+5)+6y] - D_0[x+6y]$$

Figure 9A:
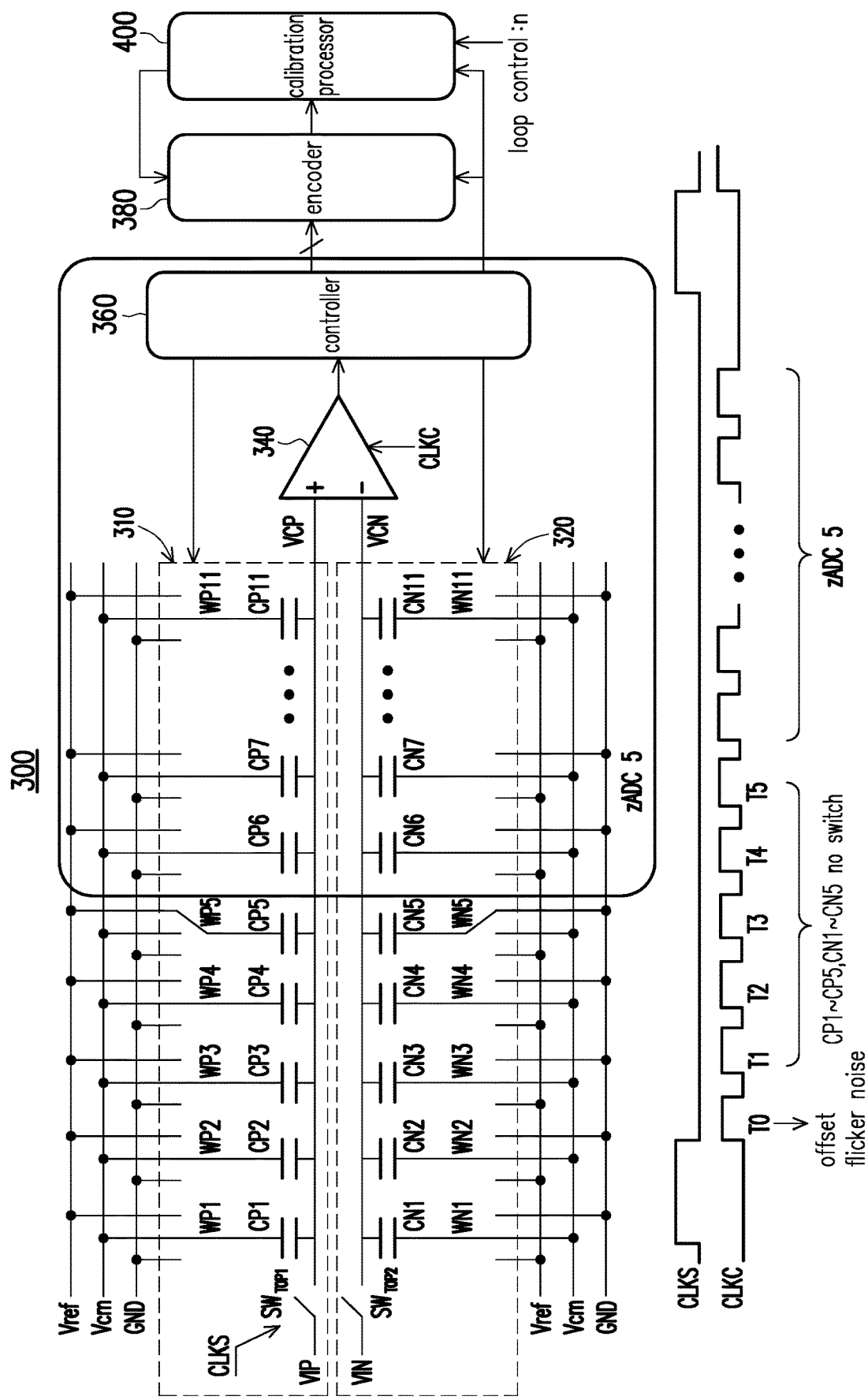
FIG. 9A is a schematic diagram of a variation of a circuit block according to an embodiment of the disclosure.

FIG. 9A is a schematic diagram of a variation of a circuit block according to an embodiment of the disclosure. As shown in FIG. 9A, the SAR ADC 300 may further include an encoder 380, coupled to the controller 360 and configured to receive the output of the controller 360; and a calibration processor 400, coupled to the encoder 380. In the calibration mode, taking the capacitors CP5 and CN5 as examples, the SAR ADC 300 outputs a binary digital result to the encoder 380, the encoder 380 encodes the binary digital result to generate a decimal encoding result, and the encoding result is then sent to the calibration processor 400. The calibration processor 400 may use a loop to average the calibration procedures performed y times. In an embodiment, the calculation of Equation (1) may be performed by the calibration processor 400. In an embodiment, the averaged capacitor weights $W_{C1avg}$ to $W_{C5avg}$ may be used to correct the digital codes output by the first CDAC 310 and/or the second CDAC 320. The analog-to-digital conversion is performed in the operation mode to obtain an accurate result of the analog-to-digital conversion. In an embodiment, by averaging data obtained from multiple calibrations, the influence of white noise may be eliminated. In an embodiment, an unaveraged single capacitor weight $W_{C1}$ to $W_{C5}$ may be used to correct the digital codes output by the first CDAC 310 and/or the second CDAC 320.

Figure 9B:
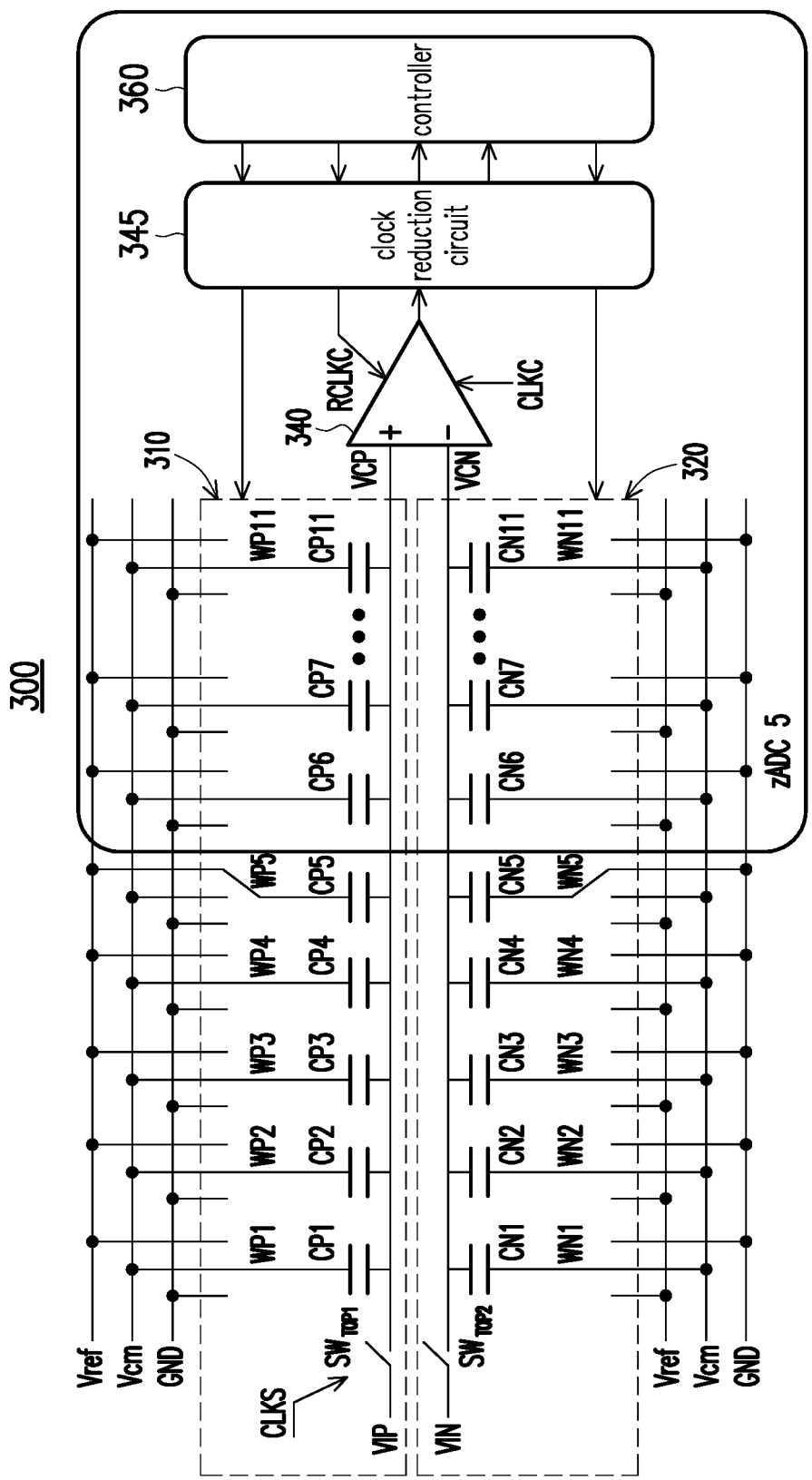
FIG. 9B is a schematic diagram of a variation of a circuit block according to an embodiment of the disclosure.

FIG. 9B is a schematic diagram of a variation of a circuit block according to an embodiment of the disclosure. As shown in FIG. 9B, the SAR ADC 300 may further include a clock reduction circuit 345, which may be configured to generate a reduced comparator clock RCLKC. In an embodiment, the clock reduction circuit 345 may reduce the comparator clock CLKC to generate the reduced comparator clock RCLKC. In an embodiment, the reduced comparator clock RCLKC may be used to further reduce the calibration time.

In the above embodiment, after the noise is measured, the calibration begins with the capacitor to be calibrated closest to the LSB and ends with the capacitor to be calibrated closest to the MSB. For example, the calibration of the capacitors CP1 to CP5 and CN1 to CN5 begins with the capacitors CP5 and CN5, and the capacitors CP1 and CN1 are then calibrated in sequence. According to such sequence, the first calibrated capacitors CP5 and CN5 are the capacitors to be calibrated closest to the LSB, and the capacitors CP6 to CP11 and CN6 to CN11 as the basis of the calibration are all accurate capacitors. After calibrating the capacitors CP5 and CN5, the capacitors CP5 to CP11 and CN5 to CN11 are used to calibrate the next capacitors CP4 and CN4 to be calibrated that are closest to the LSB. By analogy, the capacitor to be calibrated closest to the LSB is calibrated each time, and the capacitors used to calibrate the capacitor to be calibrated includes the previously calibrated capacitors and the accurate capacitors.

However, the disclosure is not limited thereto. In another embodiment, after measuring the noise, the calibration begins with the capacitor to be calibrated closest to the MSB and ends with the capacitor to be calibrated closest to the LSB. However, the descriptions of the calibration from the MSB side to the LSB side are as follows.

First, the capacitors CP2 to CP11 and CN2 to CN11 (for example, the zADC 1 in FIG. 8) are used to calibrate the capacitors CP1 and CN1. At this time, the capacitors CP6 to CP11 and CN6 to CN11 in the zADC 1 are accurate, but the capacitors CP2 to CP5 and CN2 to CN5 have not been calibrated. Therefore, when weights $W_{C1}'$ of the capacitors CP1 and CN1 are obtained using the above manner, the $W_{C1}'$ may contain the errors of the capacitors CP2 to CP5 and CN2 to CN5. Similarly, weights $W_{C2}'$ of the capacitors CP2 and CN2 may contain the errors of the capacitors CP3 to CP5 and CN3 to CN5, a weight $W_{C3}'$ of the capacitor CP3 may contain the errors of the capacitors CP4 to CP5 and CN4 to CN5, and weights $W_{C4}'$ of the capacitors CP4 and CN4 may contain the errors of the capacitors CP5 and CN5. When calibrating the capacitors CP5 and CN5, the manner is the same as or similar to that shown in FIG. 7, and the correct capacitor weight $W_{C5}$ of the capacitors CP5 and CN5 may be obtained.

Then, from the calibration processor 400 shown in FIG. 9A or FIG. 9B, the capacitor weight $W_{C5}$ of the capacitors CP5 and CN5 are used to calculate the correct capacitor weight $W_{C4}$ of the capacitors CP4 and CN4, and the weights $W_{C5}$ and $W_{C4}$ of the capacitors CP5 and CN5 and the capacitors CP4 and CN4 are used to calculate the correct capacitor weight $W_{C3}$ of the capacitors CP3 and CN3. By analogy, the weights $W_{C5}$ to $W_{C2}$ are finally used to calculate the correct capacitor weights $W_{C1}$ of the capacitors CP1 and CN1. In an embodiment, the calculation manner of the average capacitor weights of the capacitors CP1 to CP5 and CN1 to CN5 may be obtained by calculating Equation (1).

In an embodiment, if the accurate capacitors of the SAR ADC are from the 0-th to the a-th bit, then in an embodiment, the calibration sequence may begin with the i-th bit, where i=a+1, and is repeatedly and progressively increased upward to generate the capacitor weight of each capacitor until the capacitor weight of the (Nd−1)-th bit is generated. In an embodiment, the calibration sequence may begin with the i-th bit, where i=Nd−1, and is repeatedly and progressively decreased downward to generate the capacitor weight of each capacitor until the capacitor weight of the (a+1)-th bit is generated.

In an embodiment, the calibration timing uses the clock timing of the SAR ADC in the operation mode. Therefore, it is possible to achieve the capacitor calibration and the measurements of the flicker noise and the offset of the comparator 340 without adding or changing the hardware structure of the circuit. In another embodiment, the calibration time may be further reduced. For example, as shown in FIG. 7, when the capacitors CP5 and CN5 are calibrated, the timing of the original operation mode is used. During the cycles T0 to T4 of the comparator clock CLKC, the capacitor is not switched. Therefore, the cycles T0 to T4 may be reduced to reduce the calibration time.

FIG. 10A and FIG. 10B are schematic diagrams of clock signal reduction according to an embodiment of the disclosure. As shown in the upper half of FIG. 10A, in the operation mode, the cycle T0 is the cycle of the sample-and-hold operation, and the cycles T1 to T5 are the corresponding analog-to-digital conversion cycles of the capacitors CP1 to CP5 and CN1 to CN5. In the calibration mode, after measuring the flicker noise and the offset of the comparator 340, the capacitors CP1 to CP5 and CN1 to CN5 are not switched during the cycles T1 to T5, and the analog-to-digital conversion of the zADC 5 is performed until the next cycle of the comparator clock CLKC. In an embodiment, as shown in the lower half of FIG. 10A, the cycles T1 to T5 are omitted in the calibration mode. That is, the operation of the zADC 5 is performed in the next cycle of the cycle T0, and the timing thereof is shown as the waveform of the reduced comparator clock RCLKC.

In an embodiment, as shown in the upper half of FIG. 10B, in the operation mode, the cycle T0 is the cycle of the sample-and-hold operation, and the cycles T1 to T5 are the corresponding analog-to-digital conversion cycles of the capacitors CP1 to CP5 and CN1 to CN5. In the calibration mode, after measuring the flicker noise and the offset of the comparator 340, the capacitors CP1 to CP4 and CN1 to CP4 are not switched during the cycles T1 to T4. The voltages of the second terminals of the capacitors CP5 and CN5 are switched in the cycle T5, and the analog-to-digital conversion of the zADC 5 is then performed. In an embodiment, as shown in the lower half of FIG. 10B, the cycles T0 to T4 are omitted in the calibration mode. In other words, after the sampling clock CLKS is switched to the low voltage, the first cycle of the comparator clock CLKC may be the cycle T5. The calibration procedures of the capacitors CP5 and CN5 are performed, and the timing thereof is shown as the waveform of the reduced comparator clock RCLKC. In the embodiment, there is no need to wait for the cycles T0 to T4, so that the calibration time is faster. Similarly, when calibrating the capacitors CP4 and CN4, the waiting cycle of the cycles T0 to T3 may be omitted. When calibrating the capacitors CP3 and CN3, the waiting cycle of the cycles T0 to T2 may be omitted. When calibrating the capacitors CP2 and CN2, the waiting cycle of the cycles T0 to T1 may be omitted. When calibrating the capacitors CP1 and CN1, the waiting cycle of the cycle T0 may be omitted. In this way, the overall calibration time may be further shortened.

In an embodiment, the CDAC has Nd bits, where Nd is a positive integer. When the capacitor of the i-th bit is calibrated, the reduced comparator clock RCLKC omits the waiting cycle of the (Nd−1)-bit to the (i+1)-th bit capacitors in the operation mode timing (the comparator clock CLKC), where i is an integer less than Nd. In an embodiment, as shown in FIG. 9B, the clock reduction circuit 345 may be added to the SAR ADC 300 and is configured to perform clock reduction, that is, to reduce the comparator clock CLKC of the operation mode to the reduced comparator clock RCLKC, which omits the waiting cycle.

In addition, in the above calibration procedure, when calibrating the capacitor to be calibrated, the voltage of the second terminal of the capacitor to be calibrated of the first CDAC 310 is switched to be connected to the second reference voltage Vref, and the second terminal of the capacitor to be calibrated of the second CDAC 320 is switched to be connected to the third reference voltage GND, but the disclosure is not limited thereto. For example, the voltage of the second terminal of the capacitor to be calibrated of the first CDAC 310 is switched to be connected to the third reference voltage GND, and the second terminal of the capacitor to be calibrated of the second CDAC 320 is switched to be connected to the second reference voltage Vref. In another embodiment, the voltage of the second terminal of the capacitor to be calibrated of the first CDAC 310 may be connected to the second reference voltage Vref or the third reference voltage GND, that is, may be switched to different reference voltages, and may also be switched to other voltages in another embodiment. Similarly, the voltage of the second terminal of the capacitor to be calibrated of the second CDAC 320 may be connected to the second reference voltage Vref or the third reference voltage GND, that is, may be switched to different reference voltages, and may also be switched to other voltages in another embodiment. In another embodiment, the second reference voltage may be one of the Vref or the GND, and the third reference voltage may be the other one of the Vref or the GND. For example, the second reference voltage may be the GND, and the third reference voltage may be the Vref.

In the above embodiment, a differential circuit (such as the circuit shown in FIG. 3) is used to illustrate the capacitor calibration procedure, but a single-ended circuit (such as the circuit shown in FIG. 1) may also be applied to the capacitor calibration method of the disclosure. That is, the input terminal of the comparator 340 being connected to only one CDAC may also be applied to the capacitor calibration method of the disclosure. The capacitor calibration method under the single-ended circuit architecture is the same or similar to the calibration method of the differential circuit, and the description thereof is omitted here.

Figure 11:
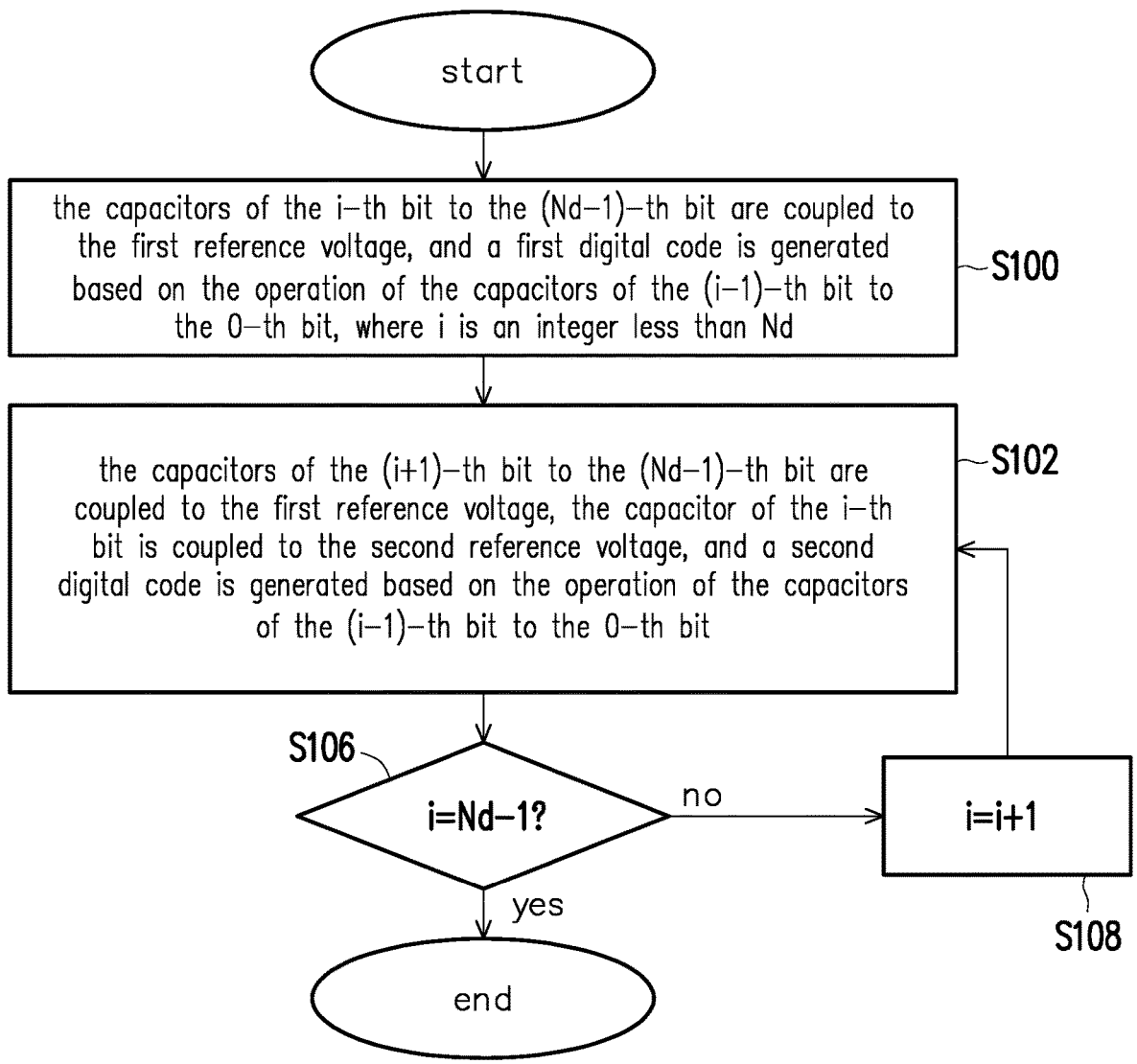
FIG. 11 is a flowchart of a calibration method of an SAR ADC according to the disclosure.

FIG. 11 is a flowchart of a calibration method of an SAR ADC according to the disclosure. In an embodiment, the SAR ADC includes at least one Nd-bit CDAC. The capacitors of the CDAC correspond to the 0-th bit to the (Nd−1)-th bit. The capacitor of the 0-th bit to the capacitor of the (i−1)-th bit are, for example, the accurate capacitors (such as the capacitors CP11 to CP6 and CN11 to CN6), and the capacitor of the i-th bit to the capacitor of the (Nd−1)-th bit are, for example, the capacitors to be calibrated (such as the capacitors CP5 to CP1 and CN5 to CN1), where i is an integer less than Nd. In an embodiment, the digital code converted by the Nd-bit CDAC is converted by the SAR ADC to obtain digital codes of (Nd+1) bits. For example, the SAR ADC does not need capacitor operation, and compares the difference between the VIP and the VIN to obtain the digital code of 1 more bit. As shown in FIG. 11, in Step S100, the capacitors of the i-th bit to the (Nd−1)-th bit are coupled to the first reference voltage, and a first digital code is generated based on the operation of the capacitors of the (i−1)-th bit to the 0-th bit, where i is an integer less than Nd. In an embodiment, the noise may be obtained in Step S100. The noise may include the flicker noise and the comparator offset.

In an embodiment, the first terminals of the capacitors of the (Nd−1)-th bit to the 0-th bit are connected to the input voltage (such as the VIP and the VIN), and the second terminals of capacitors are connected to the first reference voltage (such as the Vcm). The first terminals of the capacitors of the (Nd−1)-th bit to the 0-th bit are disconnected from the input voltage, and the first digital code is generated using the SAR ADC corresponding to the capacitors of the (i−1)-th bit to the 0-th bit to measure the noise.

Then, Step S102 is executed. In Step S102, the capacitors of the (i+1)-th bit to the (Nd−1)-th bit are coupled to the first reference voltage, the capacitor of the i-th bit is coupled to the second reference voltage, and a second digital code is generated based on the operation of the capacitors of the (i−1)-th bit to the 0-th bit. In an embodiment, in Step S102, the capacitor of the i-th bit is calibrated based on the operation of the capacitors of the (i−1)-th bit to the 0-th bit, the second digital code is generated by the comparator, and the second digital code is deducted by the first digital code to generate a weight of the capacitor of the i-th bit.

In an embodiment, the capacitor of the i-th bit is coupled to the second reference voltage or the third reference voltage, and the capacitors of the (Nd−1)-th bit to the (i+1)-th bit are coupled to the first reference voltage. The second digital code is generated using the SAR ADC corresponding to the capacitors of the (i−1)-th bit to the 0-th bit, and a weight of the capacitor of the i-th bit is generated based on the second digital code and the first digital code.

In an embodiment, the first terminals of the capacitors (such as the CP1 to CP11 and CN1 to CN11) of the (Nd−1)-th bit to the 0-th bit are connected to the input voltage (such as the VIP and VIN), and the second terminals of capacitors are connected to the first reference voltage (such as the Vcm). The first terminals of the capacitors of the (Nd−1)-th bit to the 0-th bit are disconnected from the input voltage. The second terminal of the capacitor of the i-th bit is coupled to the second reference voltage (such as the Vref) or the third reference voltage (such as the GND). The second digital code is generated using the SAR ADC corresponding to the capacitors of the (i−1)-th bit to the 0-th bit, and the capacitor weight of the capacitor of the i-th bit is generated based on the second digital code and the first digital code.

In Step S106, it is judged whether i is already equal to Nd−1, that is, whether the action has been performed to the (Nd−1)-th bit. If the action has not been performed to the (Nd−1)-th bit, that is, the judgment result is no, then Step S108 is performed. In Step S108, i is progressively increased, that is, i=i+1, and then Step S102 is continued to be performed until i=Nd−1. In addition, in Step S106, if it is judged that i is already equal to Nd−1, that is, the capacitor weights of the capacitors until the (Nd−1)-th bit have all been generated, and the calibration of the SAR ADC has been completed. In an embodiment, a step may be added between Steps S102 and S106 to generate the capacitor weight of the capacitor of the i-th bit based on the first digital code and the second digital code. In an embodiment, after it is judged that i=Nd−1 in Step S106, the capacitor weight of the capacitor of each bit may be generated based on each second digital code obtained by performing Step S102 each time. After obtaining the capacitor weight of each bit or the capacitor weights of all the bits, the corresponding SAR ADC may be corrected based on the obtained capacitor weight.

Figure 12:
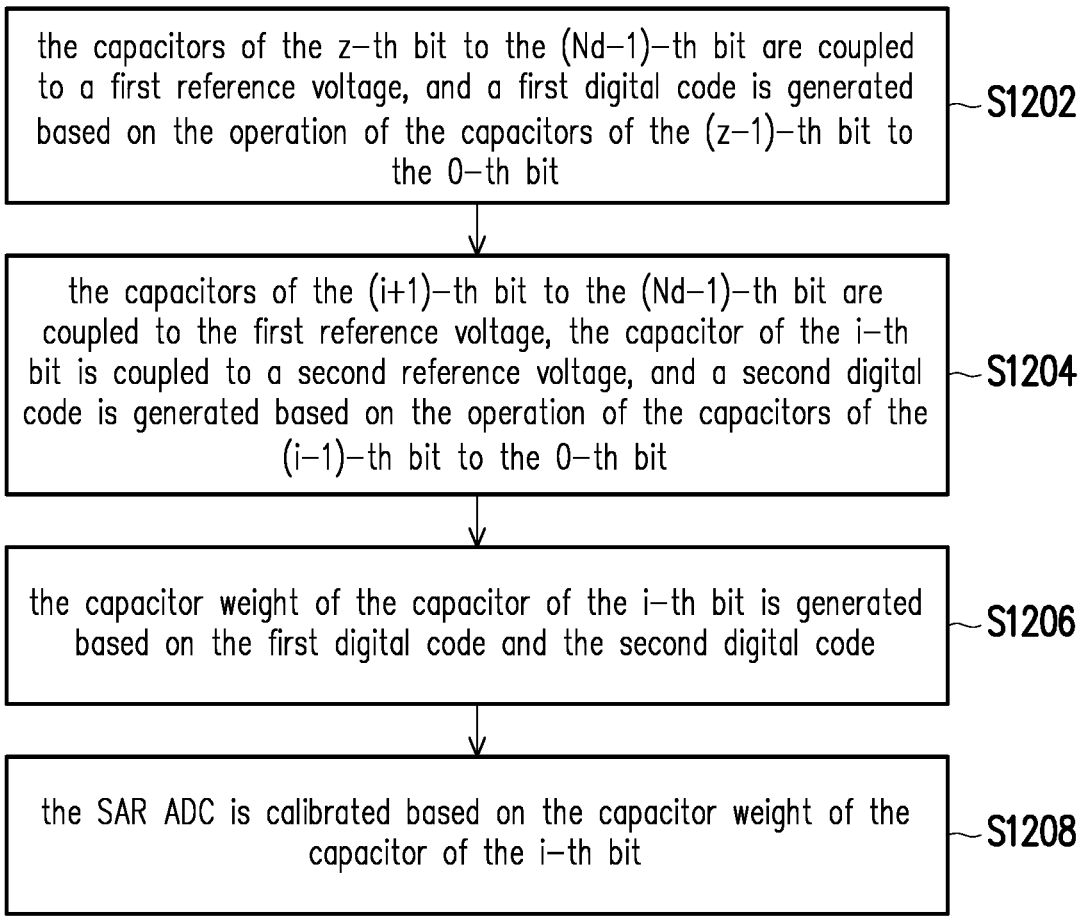
FIG. 12 is a flowchart of a calibration method of an SAR ADC according to an embodiment of the disclosure.

FIG. 12 is a flowchart of a calibration method of an SAR ADC according to an embodiment of the disclosure. In the embodiment, it is not necessary to use all accurate capacitors to obtain the flicker noise and the comparator offset. The SAR ADC includes at least one CDAC and a controller. The at least one CDAC includes Nd capacitors corresponding to Nd bits, where Nd is a positive integer. As shown in FIG. 12. In Step S1202, the capacitors of the z-th bit to the (Nd−1)-th bit are coupled to a first reference voltage, and a first digital code is generated based on the operation of the capacitors of the (z−1)-th bit to the 0-th bit, where z is an integer less than Nd. In an embodiment, for example, the CDAC of the 0-th to the 5-th bits have accurate capacitors. Nd is, for example, 11 and z is, for example, 5. The capacitors of the 5-th bit to the 10-th bit are coupled to the first reference voltage, and the first digital code is generated based on the operation of the capacitors of the 4-th bit to the 0-th bit. The first digital code includes the flicker noise and the comparator offset. In Step S1204, the capacitors of the (i+1)-th bit to the (Nd−1)-th bit are coupled to the first reference voltage, the capacitor of the i-th bit is coupled to a second reference voltage, and a second digital code is generated based on the operation of the capacitors of the (i−1)-th bit to the 0-th bit, where i is an integer less than Nd, and z is less than i. In the embodiment, i is, for example, 6. The capacitors of the 7-th bit to the 10-th bit are coupled to the first reference voltage, the capacitor of the 6-th bit is coupled to the second reference voltage, and the second digital code is generated based on the operation of the capacitors of the 5-th bit to the 0-th bit. In Step S1206, the capacitor weight of the capacitor of the i-th bit is generated based on the first digital code and the second digital code. In the embodiment, the capacitor weight of the capacitor of the 6-th bit is generated using the first digital code generated by the operation of the capacitors of the 4-th bit to the 0-th bit and using the second digital code generated by the capacitors of the 5-th bit to the 0-th bit. In Step S1208, the SAR ADC is calibrated based on the capacitor weight of the capacitor of the i-th bit.

Figure 13:
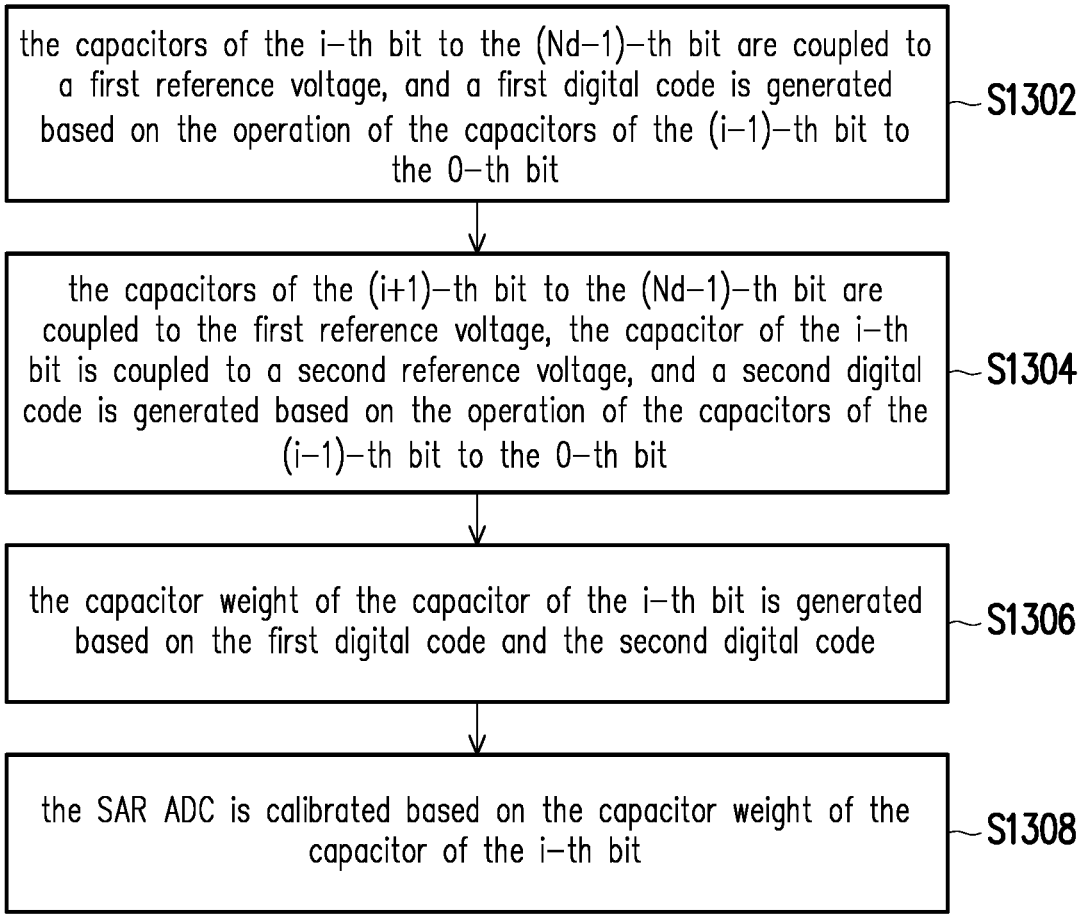
FIG. 13 is a flowchart of a calibration method of an SAR ADC according to an embodiment of the disclosure.

FIG. 13 is a flowchart of a calibration method of an SAR ADC according to an embodiment of the disclosure. The SAR ADC includes at least one CDAC and a controller. The at least one CDAC includes Nd capacitors corresponding to Nd bits, where Nd is a positive integer. As shown in FIG. 13. In Step S1302, the capacitors of the i-th bit to the (Nd−1)-th bit are coupled to a first reference voltage, and a first digital code is generated based on the operation of the capacitors of the (i−1)-th bit to the 0-th bit, where i is an integer less than Nd. In an embodiment, Nd is, for example, 11 and i is, for example, 6. The capacitors of the 6-th bit to the 10-th bit are coupled to the first reference voltage, and the first digital code is generated based on the operation of the capacitors of the 5-th bit to the 0-th bit. The first digital code includes the flicker noise and the comparator offset. In Step S1304, the capacitors of the (i+1)-th bit to the (Nd−1)-th bit are coupled to the first reference voltage, the capacitor of the i-th bit is coupled to a second reference voltage, and a second digital code is generated based on the operation of the capacitors of the (i−1)-th bit to the 0-th bit. In the embodiment, i is, for example, 6. The capacitors of the 7-th bit to the 10-th bit are coupled to the first reference voltage, the capacitor of the 6-th bit is coupled to the second reference voltage, and the second digital code is generated based on the operation of the capacitors of the 5-th bit to the 0-th bit. In Step S1306, the capacitor weight of the capacitor of the i-th bit is generated based on the first digital code and the second digital code. In the embodiment, the capacitor weight of the capacitor of the 6-th bit is generated using the first digital code generated by the operation of the capacitors of the 5-th bit to the 0-th bit and using the second digital code generated by the capacitors of the 5-th bit to the 0-th bit. In Step S1308, the SAR ADC is calibrated based on the capacitor weight of the capacitor of the i-th bit.

From the above descriptions, it can be known that the capacitor calibration method according to the embodiments of the disclosure does not need to add an additional circuit architecture, and may be performed under the operation architecture of the original SAR ADC. For example, the comparator clock CLKC that drives the SAR ADC for analog-to-digital conversion is used as the calibration clock. During the cycles T1 to T5 of the comparator clock CLKC, the capacitors CP1 to CP5 and CN1 to CN5 may be driven to perform the analog-to-digital conversion in the operation mode. In the calibration mode, the calibrated capacitors may be connected to the second reference voltage Vref or the third reference voltage GND, and the other uncalibrated capacitors are connected to the first reference voltage Vcm. Therefore, in an embodiment, the control sequence inside the controller 360 may be changed to adapt to the operation mode and the calibration mode without drastically changing the overall circuit architecture and also without increasing the capacitor area, so the size of the overall circuit will not become larger.

In summary, based on the above descriptions of the disclosure, if the number of capacitors to be calibrated is NumC, the time required for calibration may be reduced to (NumC+1) cycles, which is about twice as fast as the 2NumC cycles required for traditional calibration. If the calibration process is repeated several times successively, the calibration process may also be used to eliminate the white noise generated by the circuit, so that the calibration is more accurate. In an embodiment of the disclosure, the information of the flicker noise and the comparator offset may be obtained without adding a circuit to the signal path.

In addition, an embodiment of the disclosure may improve the capacitor weight deviation accumulated due to calibration, so as to further improve the integral nonlinearity of the CDAC.

Based on an embodiment of the disclosure, a calibration method of an SAR ADC is provided. The SAR ADC includes at least one CDAC and a controller. The CDAC includes Nd capacitors corresponding to Nd bits, where Nd is a positive integer. The capacitor calibration method of the SAR ADC includes the following steps. The capacitors of the z-th bit to the (Nd−1)-th bit are coupled to a first reference voltage, and a first digital code is generated based on the operation of the capacitors of the (z−1)-th bit to the 0-th bit, where z is an integer less than Nd. The capacitors of the (i+1)-th bit to the (Nd−1)-th bit are coupled to the first reference voltage, the capacitor of the i-th bit is coupled to a second reference voltage, and a second digital code is generated based on the operation of the capacitors of the (i−1)-th bit to the 0-th bit, where i is an integer less than Nd, and z is less than i. The capacitor weight of the capacitor of the i-th bit is generated based on the first digital code and the second digital code. The SAR ADC is calibrated based on the capacitor weight of the capacitor of the i-th bit.

In the capacitor calibration method of the SAR ADC, the step of coupling the capacitors of the z-th bit to the (Nd−1)-th bit to the first reference voltage, and generating the first digital code based on the operation of the capacitors of the (z−1)-th bit to the 0-th bit includes the following steps. The first terminals of the capacitors of the (Nd−1)-th bit to the 0-th bit are coupled to an input voltage, and the second terminals of the capacitors of the (Nd−1)-th bit to the 0-th bit are coupled to a first reference voltage. The first terminals of the capacitors of the (Nd−1)-th bit to the 0-th bit are disconnected from the input voltage. The first digital code is generated using the SAR ADC corresponding to the capacitors of the (z−1)-th bit to the 0-th bit.

Based on an embodiment of the disclosure, a calibration method of an SAR ADC is provided. The SAR ADC includes at least one CDAC and a controller. The at least one CDAC includes Nd capacitors corresponding to Nd bits, where Nd is a positive integer. The capacitor calibration method of the SAR ADC includes the following steps. The capacitors of the i-th bit to the (Nd−1)-th bit are coupled to a first reference voltage, and a first digital code is generated based on the operation of the capacitors of the (i−1)-th bit to the 0-th bit, where i is an integer less than Nd. The capacitors of the (i+1)-th bit to the (Nd−1)-th bit are coupled to the first reference voltage, the capacitor of the i-th bit is coupled to a second reference voltage, and a second digital code is generated based on the operation of the capacitors of the (i−1)-th bit to the 0-th bit. The capacitor weight of the capacitor of the i-th bit is generated based on the first digital code and the second digital code. The SAR ADC is calibrated based on the capacitor weight of the capacitor of the i-th bit.

The capacitor calibration method of the SAR ADC further includes the following step. The capacitor calibration method is performed multiple times to obtain the average value of the capacitor weights of the i-th bit.

In the capacitor calibration method of the SAR ADC, the step of coupling the capacitors of the i-th bit to the (Nd−1)-th bit to the first reference voltage, and generating the first digital code based on the operation of the capacitors of the (i−1)-th bit to the 0-th bit includes the following steps. The first terminals of the capacitors of the (Nd−1)-th bit to the 0-th bit are coupled to an input voltage, and the second terminals of the capacitors of the (Nd−1)-th bit to the 0-th bit are coupled to a first reference voltage. The first terminals of the capacitors of the (Nd−1)-th bit to the 0-th bit are disconnected from the input voltage. The first digital code is generated using the SAR ADC corresponding to the capacitors of the (i−1)-th bit to the 0-th bit.

In the capacitor calibration method of the SAR ADC, the step of coupling the capacitors of the (i+1)-th bit to the (Nd−1)-th bit to the first reference voltage, coupling the capacitor of the i-th bit to the second reference voltage, and generating the second digital code based on the operation of the capacitors of the (i−1)-th bit to the 0-th bit includes the following steps. The second terminals of the capacitors of the (i+1)-th bit the (Nd−1)-th bit are coupled to the first reference voltage, and the second terminal of the capacitor of the i-th bit is coupled to the second reference voltage. The second digital code is generated using the SAR ADC corresponding to the capacitors of the (i−1)-th bit to the 0-th bit.

In the capacitor calibration method of the SAR ADC, the at least one CDAC includes a first CDAC and a second CDAC. The step of coupling the second terminal of the capacitor of the i-th bit to the second reference voltage includes the following steps. The second terminal of the capacitor of the i-th bit of the first CDAC is coupled to the second reference voltage. The second terminal of the capacitor of the i-th bit of the second CDAC is coupled a third reference voltage.

In the capacitor calibration method of the SAR ADC, the SAR ADC further includes a comparator. The input voltage is determined by the input common mode voltage of the comparator.

The capacitor calibration method of the SAR ADC further includes the following steps. After generating the second digital code, the capacitors of the (i+2)-th bit to the (Nd−1)-th bit of are coupled to the first reference voltage, the capacitor of the (i+1)-th bit is coupled to the second reference voltage, and a third digital code is generated based on the operation of the capacitors of the i-th bit to the 0-th bit. The capacitor weight of the capacitor of the i-th bit is generated based on the first digital code and the third digital code. In an embodiment, i is repeatedly and progressively increased upward to generate the capacitor weight of each capacitor until the capacitor weight of the (Nd−1)-th bit is generated.

The capacitor calibration method of the SAR ADC further includes the following steps. After generating the second digital code, the capacitors of the i-th bit to the (Nd−1)-th bit are coupled to the first reference voltage, the capacitor of the (i−1)-th bit is coupled to the second reference voltage, and the third digital code is generated based on the operation of the capacitors of the (i−2)-th bit to the 0-th bit. The capacitor weight of the capacitor of the (i−1)-th bit is generated based on the first digital code and the third digital code. In an embodiment, i is repeatedly and progressively decreased downward to generate the capacitor weight of each capacitor until the capacitor weight of the (a+1)-th bit is generated.

The capacitor calibration method of the SAR ADC further includes the following step. The capacitor weight of the capacitor of the j-th bit is obtained based on the capacitor weights of the capacitors of the (j−1)-th bit to the i-th bit, where Nd>j>i.

In the capacitor calibration method of the SAR ADC, the calibration timing of the capacitor calibration method is the same as the operation mode timing of the SAR ADC.

In the capacitor calibration method of the SAR ADC, when the capacitor calibration method is calibrating the capacitor of the i-th bit, the calibration timing of the capacitor calibration method omits the waiting cycle of the capacitors of the (Nd−1)-th bit to the (i+1)-th bit in the operation mode timing.

In the capacitor calibration method of the SAR ADC, the SAR ADC further includes a comparator, and the first digital code includes the information of the flicker noise and the comparator offset.

In the capacitor calibration method of the SAR ADC, the step of generating the capacitor weight of the capacitor of the i-th bit based on the first digital code and the second digital code includes the following step. The first digital code is deducted by the second digital code to generate the capacitor weight of the capacitor of the i-th bit.

Based on another embodiment of the disclosure, an SAR ADC with calibration function is provided, which includes at least one CDAC, controlled by multiple control signals to respectively control the switching operations of Nd switching capacitors of the at least one CDAC, where Nd is a positive integer; a comparator, coupled to the at least one CDAC and configured to compare the output of the at least one CDAC with a comparison voltage; and a controller, coupled to the comparator and the at least one CDAC, and configured to generate the control signal and a digital output signal based on the output of the comparator. When the controller is in the calibration mode, the capacitor weight of the i-th bit of the at least one CDAC is obtained by the result of (Nd+1) operations of the comparator, where i is an integer less than Nd.

The SAR ADC with calibration function, when the controller is in the operation mode, the output of the at least one CDAC is approximated to the Nd-bit window based on the output of the comparator. An operation of approximating the output of the CDAC to the Nd-bit window is completed by the result of (Nd+1) comparison operations of the comparator.

Based on another embodiment of the disclosure, an SAR ADC with calibration function is provided, which includes at least one Nd-bit CDAC, having Nd capacitors, where Nd is a positive integer; and a controller, coupled to the at least one CDAC. The controller is configured to perform the following capacitor calibration procedure. The capacitors of the z-th bit to the (Nd−1)-th bit are coupled to the first reference voltage, and a first digital code is generated based on the operation of the capacitors of the (z−1)-th bit to the 0-th bit, where z is an integer less than Nd. The capacitors of the (i+1)-th bit to the (Nd−1)-th bit are coupled to the first reference voltage, and the capacitor of the i-th bit is coupled to the second reference voltage, a and a second digital code is generated based on the operation of the capacitors of the (i−1)-th bit to the 0-th bit, where i is an integer less than Nd, and z is less than i. The capacitor weight of the capacitor of the i-th bit is generated based on the first digital code and the second digital code. The SAR ADC is calibrated based on the capacitor weight of the capacitor of the i-th bit.

Based on another embodiment of the disclosure, an SAR ADC with calibration function is provided, which includes at least one Nd-bit CDAC, having Nd capacitors, where Nd is a positive integer; and a controller, coupled to the at least one CDAC. The controller is configured to perform the following capacitor calibration procedure. The capacitors of the i-th bit to the (Nd−1)-th bit are coupled to a first reference voltage, a first digital code is generated based on the operation of the capacitors of the (i−1)-th bit to the 0-th bit, where i is an integer less than Nd. The capacitors of the (i+1)-th bit to the (Nd−1)-th bit are coupled to the first reference voltage, the capacitor of the i-th bit is coupled to a second reference voltage, and a second digital code is generated based on the operation of the capacitors of the (i−1)-th bit to the 0-th bit. The capacitor weight of the capacitor of the i-th bit is generated based on the first digital code and the second digital code. The SAR ADC is calibrated based on the capacitor weight of the capacitor of the i-th bit.

In the SAR ADC with calibration function, the controller further performs the calibration procedure more times to obtain the average value of the capacitor weight of the i-th bit.

In the SAR ADC with calibration function, when the controller performs the step of coupling the capacitors of the i-th bit to the (Nd−1)-th bit to the first reference voltage, and generating the first digital code based on the operation of the capacitors of the (i−1)-th bit to the 0-th bit, the first terminals of the capacitors of the (Nd−1)-th bit to the 0-th bit are coupled to an input voltage, and the second terminals of the capacitors of the (Nd−1)-th bit to the 0-th bit are coupled to the first reference voltage. The first terminals of the capacitors of the (Nd−1)-th bit to the 0-th bit are disconnected from the input voltage. The first digital code is generated using the SAR ADC corresponding to the capacitors of the (i−1)-th bit to the 0-th bit.

In the SAR ADC with calibration function, when the controller performs the step of coupling the capacitors of the (i+1)-th bit to the (Nd−1)-th bit to the first reference voltage, coupling the capacitor of the i-th bit to the second reference voltage, and generating the second digital code based on the operation of the capacitors of the (i−1)-th bit to the 0-th bit, the second terminals of the capacitors of the (i+1)-th bit to the (Nd−1)-th bit are coupled to the first reference voltage, and the second terminal of the capacitor of the i-th bit is coupled to the second reference voltage. The second digital code is generated using the SAR ADC corresponding to the capacitors of the (i−1)-th bit to the 0-th bit.

In the SAR ADC with calibration function, the at least one CDAC includes a first CDAC and a second CDAC. When the controller performs the step of coupling of the second terminal of the capacitor of the i-th bit to the second reference voltage, the second terminal of the capacitor of the i-th bit of the first CDAC is coupled to the second reference voltage. The second terminal of the capacitor of the i-th bit of the second CDAC is coupled to a third reference voltage.

In the SAR ADC with calibration function, the SAR ADC further includes a comparator. The input voltage is determined by the input common mode voltage of the comparator.

In the SAR ADC with calibration function, and the controller is further configured to perform the following steps. After generating the second digital code, the capacitors of the (i+2)-th bit to the (Nd−1)-th bit are coupled to the first reference voltage, the capacitor of the (i+1)-th bit is coupled to the second reference voltage, and a third digital code is generated based on the operation of the capacitors of the i-th bit to the 0-th bit. The capacitor weight of the capacitor of the (i+1)-th bit is generated based on the first digital code and the third digital code.

In the SAR ADC with calibration function, the controller further performs the following steps. After generating the second digital code, the capacitors of the i-th bit to the (Nd−1)-th bit are coupled to the first reference voltage, the capacitor of the (i−1)-th bit is coupled to the second reference voltage, and a third digital code is generated based on the operation of the capacitors of the (i−2)-th bit to the 0-th bit. The capacitor weight of the capacitor of the (i−1)-th bit is generated based on the first digital code and the third digital code.

In the SAR ADC with calibration function, the controller is further configured to perform the following step. The capacitor weight of the capacitor of the j-th bit is obtained based on the capacitor weights of the capacitors of the (j−1)-th bit to the i-th bit, where Nd>j>i.

In the SAR ADC with calibration function, the calibration timing of the capacitor calibration procedure of the controller is the same as the operation mode timing of the SAR ADC.

The SAR ADC with calibration function further includes a clock reduction circuit, coupled between the controller and the comparator, and configured to omit the waiting cycle of the capacitors of the (Nd−1)-th bit to the (i+1)-th bit in the operation mode timing from the calibration timing of the capacitor calibration procedure when calibrating the capacitor of the i-th bit.

In the SAR ADC with calibration function, the SAR ADC further includes a comparator, and the first digital code includes the information of the flicker noise and the comparator offset.

In the SAR ADC with calibration function, the controller deducts the first digital code by the second digital code to generate the capacitor weight of the capacitor of the i-th bit.

Based on the above, one embodiment of the disclosure has the advantage of window switching without adding other circuits to the signal path, which affects the calibrated comparator offset and flicker noise information. In addition, one embodiment of the disclosure may also improve the capacitor weight deviation accumulated due to calibration, so as to further improve the integral nonlinearity of the CDAC.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A calibration method of a successive approximation register analog-to-digital converter (SAR ADC), wherein the SAR ADC comprises at least one capacitor digital-to-analog converter (CDAC) and a controller, the at least one CDAC comprises Nd capacitors corresponding to Nd bits, where Nd is a positive integer, and a capacitor calibration method of the SAR ADC comprises:

coupling the capacitors of a z-th bit to an (Nd−1)-th bit to a first reference voltage, and generating a first digital code based on an operation of the capacitors of a (z−1)-th bit to a 0-th bit, where z is an integer less than Nd;

coupling the capacitors of an (i+1)-th bit to the (Nd−1)-th bit to the first reference voltage, and coupling the capacitor of an i-th bit to a second reference voltage, and generating a second digital code based on an operation of the capacitors of an (i−1)-th bit to the 0-th bit, where i is an integer less than Nd, and z is less than i;

generating a capacitor weight of the capacitor of the i-th bit based on the first digital code and the second digital code; and calibrating the SAR ADC based on the capacitor weight of the capacitor of the i-th bit, wherein the step of coupling the capacitors of the z-th bit to the (Nd−1)-th bit to the first reference voltage, and generating the first digital code based on the operation of the capacitors of the (z−1)-th bit to the 0-th bit comprises:

coupling first terminals of the capacitors of the (Nd−1)-th bit to the 0-th bit to an input voltage, and coupling second terminals of the capacitors of the (Nd−1)-th bit to the 0-th bit to the first reference voltage;

disconnecting the first terminals of the capacitors of the (Nd−1)-th bit to the 0-th bit from the input voltage; and generating the first digital code using the SAR ADC corresponding to the capacitors of the (z−1)-th bit to the 0-th bit.

2. The calibration method of the SAR ADC according to claim 1 further comprises performing the capacitor calibration method a plurality of times to obtain an average value of the capacitor weights of the i-th bit.

3. The calibration method of the SAR ADC according to claim 1, wherein the step of coupling the capacitors of the (i+1)-th bit to the (Nd−1)-th bit to the first reference voltage, coupling the capacitor of the i-th bit to the second reference voltage, and generating the second digital code based on the operation of the capacitors of the (i−1)-th bit to the 0-th bit comprises:
  coupling second terminals of the capacitors of the (i+1)-th bit to the (Nd−1)-th bit to the first reference voltage, and coupling a second terminal of the capacitor of the i-th bit to the second reference voltage; and
  generating the second digital code using the SAR ADC corresponding to the capacitors of the (i−1)-th bit to the 0-th bit.

4. The calibration method of the SAR ADC according to claim 3, wherein the at least one CDAC comprises a first CDAC and a second CDAC, wherein the step of coupling the second terminal of the capacitor of the i-th bit to the second reference voltage comprises:
  coupling the second terminal of the capacitor of the i-th bit of the first CDAC to the second reference voltage; and
  coupling the second terminal of the capacitor of the i-th bit of the second CDAC to a third reference voltage.

5. The calibration method of the SAR ADC according to claim 4, wherein the SAR ADC further comprises a comparator, and the input voltage is determined by an input common mode voltage of the comparator.

6. The calibration method of the SAR ADC according to claim 1, further comprising:
  coupling the capacitors of an (i+2)-th bit to the (Nd−1)-th bit to the first reference voltage, coupling the capacitor of the (i+1)-th bit to the second reference voltage, and generating a third digital code based on an operation of the capacitors of the i-th bit to the 0-th bit after generating the second digital code; and
  generating a capacitor weight of the capacitor of the (i+1)-th bit based on the first digital code and the third digital code.

7. The calibration method of the SAR ADC according to claim 1, further comprising:
  coupling the capacitors of the i-th bit to the (Nd−1)-th bit to the first reference voltage, coupling the capacitor of the (i−1)-th bit to the second reference voltage, and generating a third digital code based on an operation of the capacitors of an (i−2)-th bit to the 0-th bit after generating the second digital code; and
  generating a capacitor weight of the capacitor of the (i−1)-th bit based on the first digital code and the third digital code.

8. The calibration method of the SAR ADC according to claim 1, further comprising:
  obtaining a capacitor weight of the capacitor of a j-th bit based on capacitor weights of the capacitors of a (j−1)-th bit to the i-th bit, where Nd>j>i.

9. The calibration method of the SAR ADC according to claim 1, wherein a calibration timing of the capacitor calibration method is the same as an operation mode timing of the SAR ADC.

10. The calibration method of the SAR ADC according to claim 1, wherein when the capacitor calibration method is calibrating the capacitor of the i-th bit, a calibration timing of the capacitor calibration method omits a waiting cycle of the capacitors of the (Nd−1)-th bit to the (i+1)-th bit in an operation mode timing.

11. The calibration method of the SAR ADC according to claim 1, wherein the SAR ADC further comprises a comparator, and the first digital code comprises information of flicker noise and comparator offset.

12. The calibration method of the SAR ADC according to claim 1, wherein the step of generating the capacitor weight of the capacitor of the i-th bit based on the first digital code and the second digital code comprises deducting the first digital code by the second digital code to generate the capacitor weight of the capacitor of the i-th bit.

13. A calibration method of an SAR ADC, wherein the SAR ADC comprises at least one CDAC and a controller, the at least one CDAC comprises Nd capacitors corresponding to Nd bits, where Nd is a positive integer, and a capacitor calibration method of the SAR ADC comprises:
  coupling the capacitors of an i-th bit to an (Nd−1)-th bit to a first reference voltage, and generating a first digital code based on an operation of the capacitors of an (i−1)-th bit to a 0-th bit, where i is an integer less than Nd;
  coupling the capacitors of an (i+1)-th bit to the (Nd−1)-th bit to the first reference voltage, coupling the capacitor of the i-th bit to a second reference voltage, and generating a second digital code based on the operation of the capacitors of the (i−1)-th bit to the 0-th bit;
  generating a capacitor weight of the capacitor of the i-th bit based on the first digital code and the second digital code; and
  calibrating the SAR ADC based on the capacitor weight of the capacitor of the i-th bit,
  wherein the step of coupling the capacitors of the i-th bit to the (Nd−1)-th bit to the first reference voltage, and generating the first digital code based on the operation of the capacitors of the (i−1)-th bit to the 0-th bit comprises:
  coupling first terminals of the capacitors of the (Nd−1)-th bit to the 0-th bit to an input voltage, and coupling second terminals of the capacitors of the (Nd−1)-th bit to the 0-th bit to the first reference voltage;
  disconnecting the first terminals of the capacitors of the (Nd−1)-th bit to the 0-th bit from the input voltage; and
  generating the first digital code using the SAR ADC corresponding to the capacitors of the (i−1)-th bit to the 0-th bit.

14. The calibration method of the SAR ADC according to claim 13 further comprising performing the capacitor calibration method a plurality of times to obtain an average value of the capacitor weights of the i-th bit.

15. The calibration method of the SAR ADC according to claim 13, wherein the step of coupling the capacitors of the (i+1)-th bit to the (Nd−1)-th bit to the first reference voltage, and coupling the capacitor of the i-th bit to the second reference voltage, and generating the second digital code based on the operation of the capacitors of the (i−1)-th bit to the 0-th bit comprises:
  coupling second terminals of the capacitors of the (i+1)-th bit to the (Nd−1)-th bit to the first reference voltage, and coupling a second terminal of the capacitor of the i-th bit to the second reference voltage; and
  generating the second digital code using the SAR ADC corresponding to the capacitors of the (i−1)-th bit to the 0-th bit.

16. The calibration method of the SAR ADC according to claim 15, wherein the at least one CDAC comprises a first CDAC and a second CDAC, wherein the step of coupling the second terminal of the capacitor of the i-th bit to the second reference voltage comprises:

coupling the second terminal of the capacitor of the i-th bit of the first CDAC to the second reference voltage; and coupling the second terminal of the capacitor of the i-th bit of the second CDAC to a third reference voltage.

17. The calibration method of the SAR ADC according to claim 13, further comprising:
obtaining a capacitor weight of the capacitor of a j-th bit based on a capacitor weight of the capacitor of a (j−1)-th bit to the i-th bit, where Nd>j>i.

18. The calibration method of the SAR ADC according to claim 13, wherein a calibration timing of the capacitor calibration method is the same as an operation mode timing of the SAR ADC.

19. The calibration method of the SAR ADC according to claim 13, wherein when the capacitor calibration method is calibrating the capacitor of the i-th bit, a calibration timing of the capacitor calibration method omits a waiting cycle of the capacitors of the (Nd−1)-th bit to the (i+1)-th bit in an operation mode timing.

20. The calibration method of the SAR ADC according to claim 13, wherein the SAR ADC further comprises a comparator, and the first digital code comprises information of flicker noise and comparator offset.

21. The calibration method of the SAR ADC according to claim 13, wherein the step of generating the capacitor weight of the capacitor of the i-th bit based on the first digital code and the second digital code comprises deducting the first digital code by the second digital code to generate the capacitor weight of the capacitor of the i-th bit.

22. An SAR ADC with calibration function, comprising:
at least one CDAC, controlled by a plurality of control signals to respectively control a switching operation of Nd switching capacitors of the at least one CDAC, where Nd is a positive integer;
a comparator, coupled to the at least one CDAC and configured to compare an output of the at least one CDAC with a comparison voltage; and
a controller, coupled to the comparator and the at least one CDAC, and configured to generate the control signals and a digital output signal based on an output of the comparator,
wherein in a calibration mode, the controller obtains a capacitor weight of an i-th bit of the at least one CDAC by a result of (Nd+1) operations of the comparator, where is an integer less than Nd,
wherein in an operation mode, the controller approximates the output of the at least one CDAC to an Nd-bit window based on the output of the comparator, and an operation of approximating the output of the at least one CDAC to the Nd-bit window is completed by a result of (Nd+1) comparison operations of the comparator, wherein a calibration timing of the capacitor calibration procedure of the controller is the same as an operation mode timing of the SAR ADC.

23. An SAR ADC with calibration function, comprising:
at least one Nd-bit CDAC, having Nd capacitors, where Nd is a positive integer;
a controller, coupled to the at least one CDAC,
a controller, configured to perform a capacitor calibration procedure:
coupling the capacitors of a z-th bit to an (Nd−1)-th bit to a first reference voltage, and generating a first digital code based on an operation of the capacitors of a (z−1)-th bit to a 0-th bit, where z is an integer less than Nd;

coupling the capacitors of an (i+1)-th bit to the (Nd−1)-th bit to the first reference voltage, coupling the capacitor of an i-th bit to a second reference voltage, and generating a second digital code based on an operation of the capacitors of an (i−1)-th bit to the 0-th bit, where i is an integer less than Nd, and z is less than i;
generating a capacitor weight of the capacitor of the i-th bit based on the first digital code and the second digital code; and
calibrating the SAR ADC based on the capacitor weight of the capacitor of the i-th bit,
wherein the step of the controller coupling the capacitors of the z-th bit to the (Nd−1)-th bit to the first reference voltage, and generating the first digital code based on the operation of the capacitors of the (z−1)-th bit to the 0-th bit comprises:
coupling first terminals of the capacitors of the (Nd−1)-th bit to the 0-th bit to an input voltage, and coupling second terminals of the capacitors of the (Nd−1)-th bit to the 0-th bit to the first reference voltage;
disconnecting the first terminals of the capacitors of the (Nd−1)-th bit to the 0-th bit from the input voltage; and
generating the first digital code using the SAR ADC corresponding to the capacitors of the (z−1)-th bit to the 0-th bit.

24. The SAR ADC with calibration function according to claim 23, wherein the step of the controller coupling the capacitors of the (i+1)-th bit to the (Nd−1)-th bit to the first reference voltage, coupling the capacitor of the i-th bit to the second reference voltage, and generating the second digital code based on the operation of the capacitors of the (i−1)-th bit to the 0-th bit comprises:
coupling second terminals of the capacitors of the (i+1)-th bit to the (Nd−1)-th bit to the first reference voltage, and coupling the second terminal of the capacitor of the i-th bit to the second reference voltage; and
generating the second digital code using the SAR ADC corresponding to the capacitors of the (i−1)-th bit to the 0-th bit.

25. The SAR ADC with calibration function according to claim 24, wherein the at least one CDAC comprises a first CDAC and a second CDAC, wherein the step of the controller coupling of the second terminal of the capacitor of the i-th bit to the second reference voltage comprises:
coupling the second terminal of the capacitor of the i-th bit of the first CDAC to the second reference voltage; and
coupling the second terminal of the capacitor of the i-th bit of the second CDAC to a third reference voltage.

26. The SAR ADC with calibration function according to claim 23, wherein the controller is further configured to:
obtain a capacitor weight of the capacitor of a j-th bit based on a capacitor weight of the capacitor of a (j−1)-th bit to the i-th bit, where Nd>j>i.

27. The SAR ADC with calibration function according to claim 23, wherein a calibration timing of the capacitor calibration procedure of the controller is the same as an operation mode timing of the SAR ADC.

28. The SAR ADC with calibration function according to claim 23, further comprising:
a clock reduction circuit, coupled between the controller and a comparator, and configured to omit a waiting cycle of the capacitors of the (Nd−1)-th bit to the (i+1)-th bit in an operation mode timing from a calibration timing of the capacitor calibration procedure when calibrating the capacitor of the i-th bit.

29. The SAR ADC with calibration function according to claim 23, wherein the SAR ADC further comprises a comparator, and the first digital code comprises information of flicker noise and comparator offset.

30. The SAR ADC with calibration function according to claim 23, wherein the controller deducts the first digital code by the second digital code to generate the capacitor weight of the capacitor of the i-th bit.

31. An SAR ADC with calibration function, comprising:
at least one Nd-bit CDAC, having Nd capacitors, where Nd is a positive integer;
a controller, coupled to the at least one CDAC,
wherein the controller is configured to perform a following capacitor calibration procedure of:
coupling the capacitors of an i-th bit to an (Nd−1)-th bit to a first reference voltage, and generating a first digital code based on an operation of the capacitors of an (i−1)-th bit to a 0-th bit, where i is an integer less than Nd;
coupling the capacitors of an (i+1)-th bit to the (Nd−1)-th bit to the first reference voltage, coupling the capacitor of the i-th bit to a second reference voltage, and generating a second digital code based on the operation of the capacitors of the (i−1)-th bit to the 0-th bit;
generating a capacitor weight of the capacitor of the i-th bit based on the first digital code and the second digital code; and
calibrating the SAR ADC based on the capacitor weight of the capacitor of the i-th bit;
wherein the step of the controller coupling the capacitors of the i-th bit to the (Nd−1)-th bit to the first reference voltage, and generating the first digital code based on the operation of the capacitors of the (i−1)-th bit to the 0-th bit comprises:
coupling first terminals of the capacitors of the (Nd−1)-th bit to the 0-th bit to an input voltage, and coupling second terminals of the capacitors of the (Nd−1)-th bit to the 0-th bit to the first reference voltage;
disconnecting the first terminals of the capacitors of the (Nd−1)-th bit to the 0-th bit from the input voltage; and
generating the first digital code using the SAR ADC corresponding to the capacitors of the (i−1)-th bit to the 0-th bit.

* * * * *